(12) United States Patent
Dong

(10) Patent No.: US 12,419,184 B2
(45) Date of Patent: Sep. 16, 2025

(54) DISPLAY PANEL AND DISPLAY DEVICE

(71) Applicant: Shanghai Tianma Micro-Electronics Co., Ltd., Shanghai (CN)

(72) Inventor: Dan Dong, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 505 days.

(21) Appl. No.: 17/980,971

(22) Filed: Nov. 4, 2022

(65) Prior Publication Data

US 2024/0040828 A1    Feb. 1, 2024

(30) Foreign Application Priority Data

Jul. 29, 2022   (CN) .......................... 202210906565.0

(51) Int. Cl.
  *H10K 50/86*    (2023.01)
  *H10K 59/35*    (2023.01)
  *H10K 59/65*    (2023.01)

(52) U.S. Cl.
  CPC ......... *H10K 50/865* (2023.02); *H10K 59/353* (2023.02); *H10K 59/65* (2023.02)

(58) Field of Classification Search
  CPC .... H10K 50/865; H10K 59/353; H10K 59/65; H10K 59/121; H10K 59/8792; H10K 59/352
  See application file for complete search history.

(56) References Cited

U.S. PATENT DOCUMENTS

| | | | |
|---|---|---|---|
| 2020/0293739 A1* | 9/2020 | Yang | G06V 40/1318 |
| 2021/0265434 A1* | 8/2021 | Wu | H10K 50/865 |
| 2021/0375969 A1* | 12/2021 | Wu | G06V 10/143 |
| 2022/0181590 A1* | 6/2022 | Li | H10K 59/126 |
| 2022/0376215 A1* | 11/2022 | Gao | H10K 59/1201 |
| 2023/0097396 A1* | 3/2023 | Zeng | H10K 59/126 257/40 |
| 2023/0247865 A1* | 8/2023 | Cui | H10K 59/126 257/40 |

FOREIGN PATENT DOCUMENTS

WO    WO-2021035401 A1 *  3/2021  ......... H01L 27/3218

* cited by examiner

*Primary Examiner* — S M Sohel Imtiaz

(74) *Attorney, Agent, or Firm* — Anova Law Group, PLLC

(57) ABSTRACT

A display panel and a display device are provided. The display panel includes: a substrate; light-emitting elements on the substrate; and a light-blocking structure on one light-emitting element. One light-emitting element includes a first light-emitting element and a second light-emitting element. An area of an orthographic projection of the first light-emitting element is S1, and an area of an orthographic projection of one second light-emitting element is S2. One light-blocking structure includes a first light-blocking structure and a second light-blocking structure. An orthographic projection of one first light-blocking structure at least partially surrounds one corresponding first light-emitting element and a distance from the first light-blocking structure to the first light-emitting element is d1. An orthographic projection of one second light-blocking structure at least partially surrounds one corresponding second light-emitting element and a distance from the second light-blocking structure to the second light-emitting element is d2. |S1−S2|>0, and |d1−d2|>0.

20 Claims, 21 Drawing Sheets

DISPLAY PANEL AND DISPLAY DEVICE

CROSS-REFERENCE TO RELATED APPLICATION

This application claims the priority of Chinese Patent Application No. 202210906565.0, filed on Jul. 29, 2022, the content of which is incorporated herein by reference in its entirety.

TECHNICAL FIELD

The present disclosure generally relates to the field of display technologies and, more particularly, relates to a display panel and a display device.

BACKGROUND

With the continuous development of display technology, the manufacturing technology of display panels is also becoming mature. Existing display panels mainly include liquid crystal display (LCD), organic light-emitting Diode (OLED), and so on. An organic light-emitting display device, which is a self-luminous display device, does not require a separate light source, can operate at a low voltage, is lightweight and thin, and provides high-quality characteristics including self-luminescence, a wide viewing angle, high contrast, and fast response. Therefore, organic light-emitting display devices have been attracting attention as next-generation display devices. A general organic light-emitting display device is a self-emission type display device including organic light-emitting elements (OLEDs), and one OLED includes a hole injection electrode, an electron injection electrode, and an organic emission layer between the hole injection electrode and the electron injection electrode. In the organic light-emitting display device, holes injected from the hole injection electrode and electrons injected from the electron injection electrode may combine in the organic emission layer to generate excitons, and the excitons may transit from an excited state to a ground state and generate light, realizing a picture show.

With the development of display technology, the lifespan of luminescent materials, the functions undertaken by the regions, and the luminous color of different sub-pixels on the display panel have different effects on the display effect. Therefore, the white light characteristics of the display panel under different viewing angles shows obvious difference. It is easy to affect the uniformity of the white light characteristics of the display panel under different viewing angles and affect the display quality.

Therefore, to provide a display panel and a display device capable of improving the difference in white light characteristics under different viewing angles, therefore improving the uniformity of white light characteristics under different viewing angles and display quality, is a technical problem to be solved.

SUMMARY

One aspect of the present disclosure provides a display panel. The display panel includes: a substrate; light-emitting elements on a side of the substrate; and a light-blocking structure on a side of one light-emitting element away from the substrate. One light-emitting element includes a first light-emitting element and a second light-emitting element. An area of an orthographic projection of one first light-emitting element on the substrate is S1, and an area of an orthographic projection of one second light-emitting element on the substrate is S2. One light-blocking structure includes a first light-blocking structure and a second light-blocking structure. An orthographic projection of one first light-blocking structure on the substrate at least partially surrounds one corresponding first light-emitting element and a distance from the first light-blocking structure to the corresponding first light-emitting element along a first direction is d1. An orthographic projection of one second light-blocking structure on the substrate at least partially surrounds one corresponding second light-emitting element and a distance from the second light-blocking structure to the corresponding second light-emitting element along the first direction is d2. The first direction is parallel to a plane where the display panel is located; and $|S1-S2|>0$, and $|d1-d2|>0$.

Another aspect of the present disclosure provides a display device. The display device includes a display panel. The display panel includes a substrate; light-emitting elements on a side of the substrate; and a light-blocking structure on a side of one light-emitting element away from the substrate. One light-emitting element includes a first light-emitting element and a second light-emitting element. An area of an orthographic projection of one first light-emitting element on the substrate is S1, and an area of an orthographic projection of one second light-emitting element on the substrate is S2. One light-blocking structure includes a first light-blocking structure and a second light-blocking structure. An orthographic projection of one first light-blocking structure on the substrate at least partially surrounds one corresponding first light-emitting element and a distance from the first light-blocking structure to the corresponding first light-emitting element along a first direction is d1. An orthographic projection of one second light-blocking structure on the substrate at least partially surrounds one corresponding second light-emitting element and a distance from the second light-blocking structure to the corresponding second light-emitting element along the first direction is d2. The first direction is parallel to a plane where the display panel is located; and $|S1-S2|>0$, and $|d1-d2|>0$.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
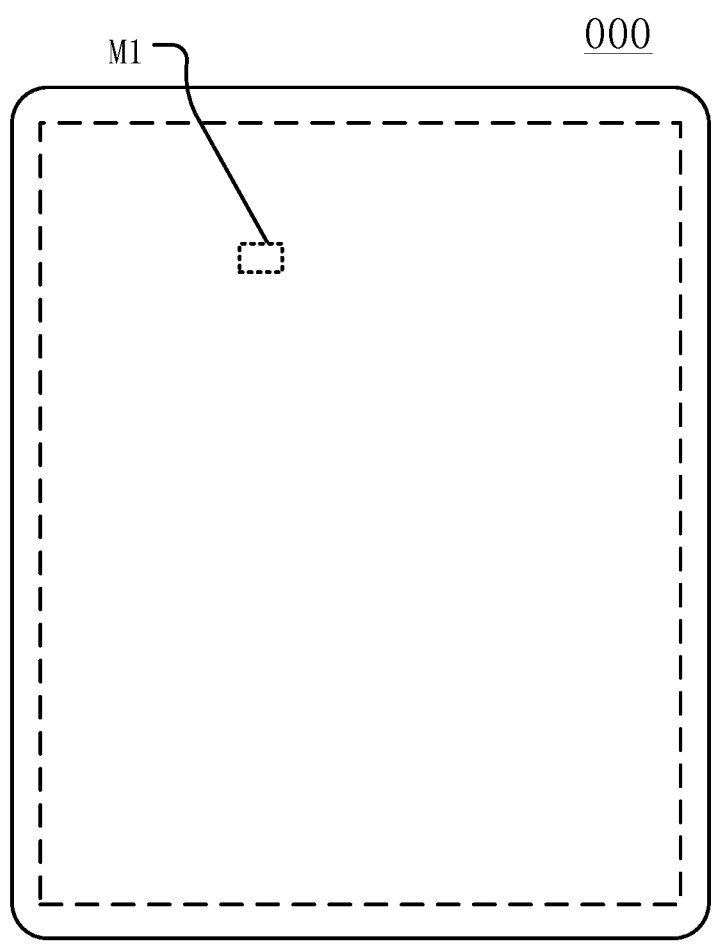
FIG. 1 illustrates a planar structure of an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Figure 2:
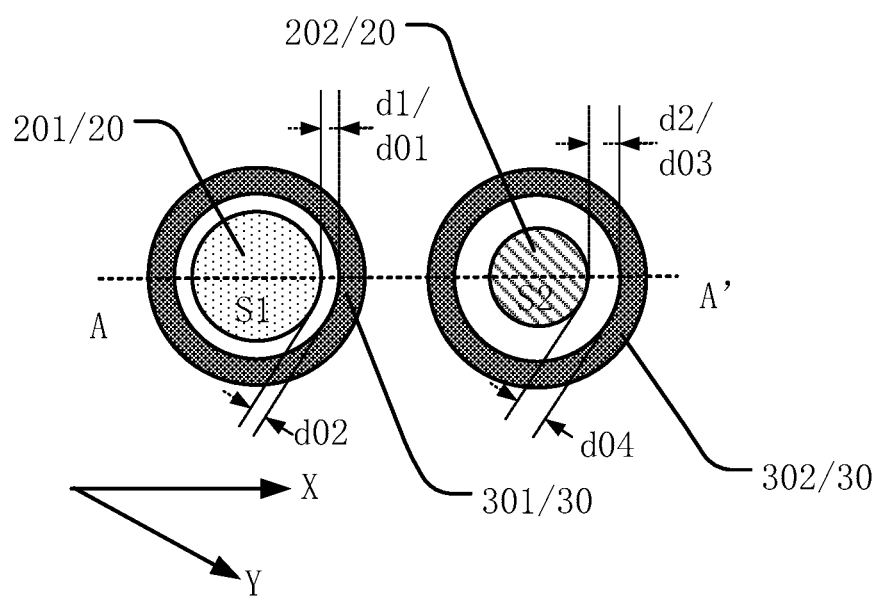
FIG. 2 illustrates a locally enlarged view of a M1 region in the display panel in FIG. 1 consistent with various disclosed embodiments in the present disclosure.
Figure 3:
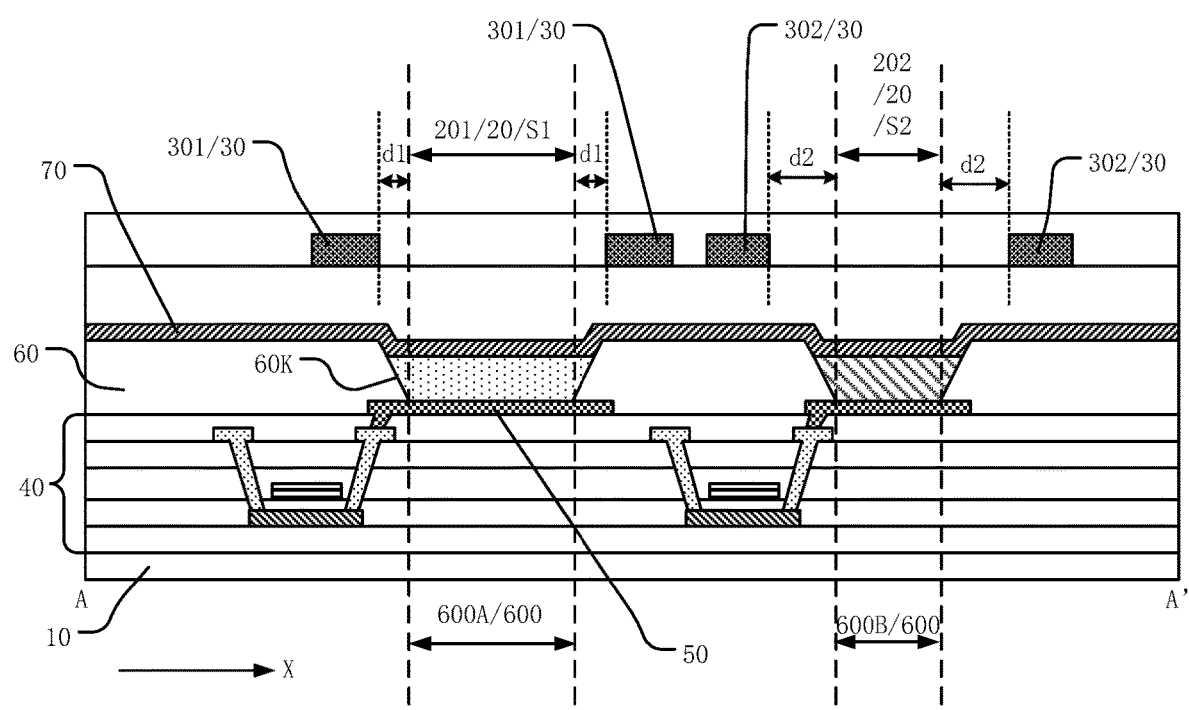
FIG. 3 illustrates a cross-sectional view of a region of the display panel in FIG. 2 along an AA' direction, consistent with various disclosed embodiments in the present disclosure.

FIG. 1 illustrates a top view of an exemplary display panel according to one embodiment of the present disclosure, FIG. 2 illustrates a locally enlarged view of a M1 region in the display panel shown in FIG. 1, FIG. 3 illustrates a cross-sectional view of the display panel in FIG. 2 along an AA' direction. As shown in FIG. 1 to FIG. 3, in one embodiment, the display panel 100 may include a substrate 10, light-emitting elements 20 on a side of the substrate 10, light-blocking structures 30 at a side of the light-emitting elements 20 away from the substrate 10.

One light-emitting element 20 may include a first light-emitting element 201 and a second light-emitting element 202. An area of an orthographic projection of the first light-emitting element 201 on the substrate 10 may be S1, and an area of an orthographic projection of the second light-emitting element 201 on the substrate 10 may be S2.

One light-blocking structure 30 may include a first light-blocking structure 301 and a second light-blocking structure 302. An orthographic projection of the first light-blocking structure 301 of one light-blocking structure 30 on the substrate 10 may at least partially surround the first light-emitting element 201 of one corresponding light-emitting element 20. Along a first direction X, a distance from the first light-blocking structure 301 to the corresponding first light-emitting element 201 may be d1.

An orthographic projection of one second light-blocking structure 302 on the substrate 10 may at least partially surround one corresponding second light-emitting element 202, and along the first direction X, a distance from the second light-blocking structure 302 to the corresponding second light-emitting element 202 may be d2. The first direction X may be parallel to the plane where the display panel 000 is located.

$$|S1-S2|>0, \text{ and } |d1-d2|>0.$$

The display panel 000 may be an organic light-emitting diode display panel. The display panel 000 may include the substrate 10 on which other film structures of the display panel 000 are fabricated. The light-emitting elements 20 may be disposed on one side of the substrate 10. It can be understood that one light-emitting element 20 of the present disclosure may be understood as at least a portion of an area corresponding to one sub-pixel of the display panel 000. Optionally, a driving circuit layer 40 may be disposed on one side of the substrate 10, and the driving circuit layer 40 may be used to fabricate a circuit structure for driving the light-emitting elements 20 to emit light, such as pixel circuits including transistors, etc. Driving signals may be provided to each light-emitting element 20 corresponding to each sub-pixel through the circuit structure in the driving circuit layer 40. An anode layer 50, a pixel definition layer 60 and a cathode layer 70 may be provided on a side of the driving circuit layer 40 away from the substrate 10. The pixel definition layer 60 may be provided with openings 60K penetrating through the thickness of the pixel definition layer 60, to form opening areas 600 of the pixel definition layer 60. One opening 60K of the pixel definition layer 60 may be used to accommodate an organic light-emitting material of one corresponding light-emitting element 20. The organic light-emitting material may be driven by the electric field formed by the anode layer 50 and the cathode layer 70, to emit light through injection and combination of carriers. Therefore, the light-emitting element 20 of one corresponding sub-pixel may emit light.

One light-emitting element 20 may include one first light-emitting element 201 and one second light-emitting element 202. The area of the orthographic projection of the first light-emitting element 201 on the substrate 10 may be S1, and the area of the orthographic projection of the second light-emitting element 201 on the substrate 10 may be S2. The area S1 of the orthographic projection of the first light-emitting element 201 on the substrate 10 may be understood as an area of an orthographic projection of one first opening area 600A in the pixel definition layer 60 corresponding to the first light-emitting element 201, and the area S2 of the orthographic projection of the second light-emitting element 202 on the substrate 10 may be understood as an area of an orthographic projection of one second opening area 600B in the pixel definition layer 60 corresponding to the second light-emitting element 202.

The display panel 000 may further include the light-blocking structures 30 at the side of the light-emitting elements 20 away from the substrate 10. The light-blocking structures 30 may be disposed between different light-emitting elements 20 for blocking, to avoid light crosstalk between different light-emitting elements 20. Optionally, the light-blocking structures 30 may be located on the side of the cathode layer 70 away from the substrate 10. In some other optional embodiments, the light-blocking structures 30 may also be located in other film layers on the side of the light-emitting elements 20 away from the substrate 10. The present disclosure has no limit on this.

One light-blocking structure 30 may include one first light-blocking structure 301 and one second light-blocking structure 302. In one light-blocking structure 30, the first light-blocking structure 301 may correspond to one first light-emitting element 201. The orthographic projection of the first light-blocking structure 301 may at least partially surround the corresponding first light-emitting element 201. In one embodiment, the orthographic projection of the first light-blocking structure 301 may surround the corresponding first light-emitting element 201, as shown in FIG. 2. In one light-blocking structure 30, the second light-blocking structure 302 may correspond to one second light-emitting element 202. The orthographic projection of the second light-blocking structure 302 may at least partially surround the corresponding second light-emitting element 202. In one embodiment, the orthographic projection of the second light-blocking structure 302 may surround the corresponding second light-emitting element 202, as shown in FIG. 2. That is, the first light-blocking structure 301 may be a least provided at a portion of the periphery of the first light-emitting element 201, and the second light-blocking structure 302 may be at least provided at a portion of the periphery of the second light-emitting element 202. It can be understood that the present disclosure does not specifically limit the material of the light-blocking structures 30, and the material only needs to be opaque and be able to play a light-blocking role.

With the development of display technology, the lifespan of the light-emitting materials of different light-emitting elements on the display panel, the functions undertaken by the regions where different light-emitting elements are located, and the light-emitting colors of different light-emitting elements have different effects on the display effect. The white light characteristics of the panels at specific viewing angles are different, which in turn easily affects the uniformity of the white light characteristics of the display panel at different viewing angles and affects the display quality of the display panel. To solve the above problems, the display panel provided by the present disclosure may adjust different light-emitting elements to different degrees according to the display differences of different light-emitting elements, to ensure that the final display effect of the display panel is uniform and good. In existing technologies, the area of a general light-emitting element, that is, the area of the corresponding opening area of the pixel definition layer in the present disclosure, and the design of the light-blocking structures, are two factors that may significantly affect the values of relative brightness of each sub-pixel after being shielded by one corresponding light-blocking structure, the change of brightness and color coordinate of each sub-pixel under a specific viewing angle.

In the display panel 000 provided by the present disclosure, along the first direction X, a distance from the first light-blocking structure 301 to the corresponding first light-emitting element 201 may be d1. A distance from the second light-blocking structure 302 to the corresponding second light-emitting element 202 may be d2. |S1−S2|>0, and |d1−d2|>0. That is, the area S1 of the orthographic projection of the first light-blocking structure 301 on the substrate 10 may be different from the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different form the distance d2 between the second light-blocking structure 302 and the second light-emitting element 202.

Figure 4:
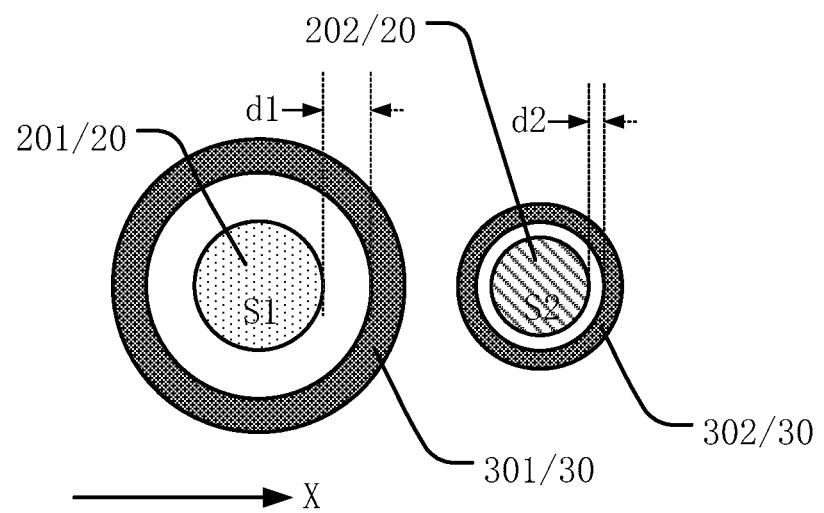
FIG. 4 illustrates an enlarged view of the M1 region of the display panel in FIG. 1, consistent with various disclosed embodiments in the present disclosure.

Optionally, in one embodiment shown in FIG. 1 and FIG. 2, the area S1 of the orthographic projection of the first light-blocking structure 301 on the substrate 10 may be larger than the area S2 of the orthographic projection of the second light-blocking structure 302 on the substrate 10. The area of the orthographic projection of the first opening area 600A in the pixel definition layer corresponding to the first light-emitting element 201 on the substrate 10 may be larger than the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be smaller than the distance d2 between the second light-blocking structure 302 and the second light-emitting element 202. In another embodiment shown in FIG. 1 and FIG. 4 which is another enlarger view of the M1 region in FIG. 1, the area S1 of the orthographic projection of the first light-blocking structure 301 on the substrate 10 may be larger than the area S2 of the orthographic projection of the second light-blocking structure 302 on the substrate 10. The area of the orthographic projection of the first opening area 600A in the pixel definition layer corresponding to the first light-emitting element 201 on the substrate 10 may be larger than the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be larger than the distance d2 between the second light-blocking structure 302 and the second light-emitting element 202. The present disclosure has no limit on this, and it may be configured according to actual requirements, as long as the area S1 of the orthographic projection of the first light-blocking structure 301 on the substrate 10 may be different from the area S2 of the orthographic projection of the second light-blocking structure 302 on the substrate 10, and the distance d1 between the first light-blocking structure 301 and the first light-emitting element 201 may be different form the distance d2 between the second light-blocking structure 302 and the second light-emitting element 202 along the first direction X.

The first direction X may be any direction parallel to the plane where the display panel 000 is located, and the present disclosure has no limit on this. The distance d1 between the first light-blocking structure 301 and the first light-emitting element 201 along the first direction X may be a minimum distance between the first light-blocking structure 301 and the first light-emitting element 201 along the first direction, that is, a minimum of distances between a side edge of the first light-blocking structure 301 close to the corresponding first light-emitting element 201 (which may also be a point, as shown in FIG. 2, according to different shape of the first light-blocking structure) and a side edge of the first light-emitting element 201 close to the corresponding first light-blocking structure 301 (which may also be a point, as shown in FIG. 2, according to different shape of the first light-emitting element). The distance d2 between the second light-blocking structure 302 and the second light-emitting element 202 along the second direction X may be a minimum distance between the second light-blocking structure 302 and the second light-emitting element 202 along the second direction, that is, a minimum of distances between a side edge of the second light-blocking structure 302 close to the corresponding second light-emitting element 202 (which may also be a point, as shown in FIG. 2, according to different shape of the second light-blocking structure) and a side edge of the second light-emitting element 202 close to the corresponding second light-blocking structure 302 (which may also be a point, as shown in FIG. 2, according to different shape of the second light-emitting element).

For description purposes only, the above embodiments where an orthographic projection of one light-emitting element 20 on the substrate 10 is a circle is used as examples to illustrate the present disclosure, and does not limit the scope of the present disclosure. In various embodiments, an orthographic projection of one light-emitting element 20 on the substrate 10 may be another suitable shape, and may be configured according to actual requirements. In one embodiment, an orthographic projection of one light-emitting element 20 on the substrate 10 may be a circle, and one light-blocking structure 30 corresponding to the light-emitting element 20 may at least partially surround the light-emitting element 20. Specifically, in one embodiment, the orthographic projection of the light-blocking structure 30 on the substrate 10 may be a ring surrounding the light-emitting element 20. In one embodiment, the orthographic projection of the light-blocking structure 30 on the substrate 10 may be an annular shape, to form the light-blocking structure 30 surrounding the light-emitting element 20. In specific implementation, the shape of the orthographic projection of the light-blocking structure 30 on the substrate 10 may include but is not limited to this embodiment, and other shapes may also be included, which are not limited in the present disclosure. During specific implementation, the shape of the orthographic projection of the light-blocking structure 30 on the substrate 10 may be set according to actual requirements.

In the present disclosure, the area S1 of the orthographic projection of the first light-blocking structure 301 on the substrate 10 may be different from the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different form the distance d2 between the second light-blocking structure 302 and the second light-emitting element 202. Therefore, for the light-emitting elements 20 with different areas, for example, for a light-emitting element 20 with a larger area, the distance between one light-emitting element 20 and its corresponding light-blocking structure 30 in the direction parallel to the plane of the display panel 000 may be designed to be larger or smaller. Correspondingly, although the areas of the light-emitting elements 20 in the display panel 000 are different, by adjusting the distance between one light-emitting element 20 and its corresponding light-blocking structure 30 in the direction parallel to the plane of the display panel 000, the relative brightness of two light-emitting elements 20 with different areas after being blocked by corresponding light-blocking structures 30 respectively may be kept consistent as much as possible, and the light-emitting brightness at a specific viewing angle may be also as consistent as possible. The display difference between different light-emitting elements 20 may be reduced, to improve the view angle difference of the white light of the display panel 000. The uniformity of white light characteristics of the display panel 000 under different viewing angles may be improved, thereby helping to improve the display quality of the display panel 000.

The embodiments shown in the drawings are used as examples only to show structures that could be included in the display panel 000. The structure of the display panel 000 may not be limited to these, and the display panel 000 may include other structures that are able to realize display function. The reference may be made to the structure of the organic light-emitting diode display panel in existing technologies, and will not be repeated here.

In some other embodiment, the display panel 000 may be a micro LED display panel or a mini LED display panel. Correspondingly, one light-emitting element 20 may be any one of a micro LED or a mini LED (not shown in the figures). Because of different service lives of micro LEDs or mini LEDs with different colors, generally when a micro LED display panel or a mini LED display panel is fabricated, the orthographic projections of the micro LEDs or the mini LEDs of different colors on the substrate 10 may have different areas. At this time, to solve the problem of different white light characteristics at a specific viewing angle caused by the different effects of the luminous color of different light-emitting elements on the display effect, based on the display difference of different micro LEDs or mini LEDs, the different micro LED or mini LED may be adjusted to different degrees, to ensure that the final display effect of the display panel is uniform and good. Optionally, in the micro LED or mini LED display panel, generally the blue micro LEDs or mini LEDs have longer lives, and an orthographic projection area of one red micro LED on the substrate 10 (it can be understood that the area S1 of the first light-emitting element 101 in FIG. 2) may be set to be larger than the area of the orthographic projection of one blue micro LED on the substrate 10 (it can be understood as the area S2 of the second light-emitting element 102 in FIG. 2), and the area of the orthographic projection of one green micro LED on the substrate 10 may be also set to be larger than the area of the orthographic projection of one blue micro LED on the substrate 10. At this time, along the first direction X, one distance between on red micro LED and its corresponding light-blocking structure may be configured to be different from the distance between one blue micro LED and its corresponding light-blocking structure. Further optional, along the first direction X, one distance between on red micro LED and its corresponding light-blocking structure may be configured to be smaller than the distance between one blue micro LED and its corresponding light-blocking structure. Similarly, the area of the orthographic projection of the green micro LED on the substrate 10 (which can be understood as the area S1 of the first light-emitting element 101 in FIG. 2) may be also set to be larger than the area of the orthographic projection of the blue micro LED on the substrate 10 (which can be understood as the area S2 of the second light-emitting element 102 in FIG. 2). At this time, along the first direction X, the distance between the green micro LED and its corresponding light-blocking structure may be set to be different from the distance between the blue micro LED and its corresponding light-blocking structure. Further optionally, in one embodiment, along the first direction X, the distance between the green micro LED and its corresponding light-blocking structure may be set to be smaller than the distance between the blue micro LED and its corresponding light-blocking structure. It can be understood that, when the display panel is a micro LED or a mini LED display panel, the distance between one light-emitting element and its corresponding light-blocking structure in the first direction may be understood as a distance between one edge of an orthographic projection of one micro-LED or one mini LED on the substrate 10 and a nearest edge of its corresponding light-blocking structure. It should be noted that the present disclosure does not describe the structure of the differential design when the display panel is a micro-LED or sub-millimeter LED display panel, and can be understood by referring to the descriptions in the above embodiments.

In some embodiments, as shown in FIG. 1 to FIG. 3, the area S1 of the orthographic projection of the first light-emitting element 201 on the substrate 10 may be larger than the area S2 of the orthographic projection of the second light-emitting element 202 on the substrate 10. That is, the area of the orthographic projection of the first opening area 600A in the pixel definition layer 60 corresponding to the first light-emitting element 201 on the substrate 10 may be larger than the area of the orthographic projection of the second opening area 600B in the pixel definition layer 60 corresponding to the second light-emitting element 202 on the substrate 10. Along the first direction, the distance d1 between the first light-blocking structure 301 and the corresponding first light-emitting element 201 may be smaller than the distance d2 between the second light-blocking structure 302 and the corresponding second light-emitting element 202. That is, S1>S2 and d1<d2.

In the present embodiment, when the area of the orthographic projection of one light-emitting element 20 in the display panel 000 on the substrate 10 is larger, the opening area 600 of the pixel definition layer 60 corresponding to the light-emitting element 20 may be also larger. Correspondingly, along the first direction X, the distance between the light-blocking structure 30 corresponding to the light-emitting element 20 and the light-emitting element 20 may be smaller. Since the area S1 of the orthographic projection of the first light-emitting element 201 on the substrate 10 is large, the lifespan of the light-emitting material of the first light-emitting element 201 may be longer, and the function undertaken by the area where the first light-emitting element 201 is located also may have a greater impact on the display effect. The brightness distribution of the first light-emitting element 201 may be relatively stronger in comparison with the second light-emitting element 202 with a smaller area. Therefore, in the present embodiment, in the first direction X, the distance d1 from the first light-blocking structure 301 to the corresponding first light-emitting element 201 may be smaller than the distance d2 from the second light-blocking structure 302 to the corresponding second light-emitting element 202. That is, the first light-blocking structure 301 may be closer to the edge of the corresponding first light-emitting element 201, and may block more light-emitting range of the corresponding first light-emitting element 201. The distance d2 from the second light-blocking structure 302 to the corresponding second light-emitting element 202 may be larger. That is, the second light-blocking structure 302 may be further away from the edge position of the corresponding second light-emitting element 202, and may block less light-emitting range of the second light-emitting element 202. Therefore, even the area S1 of the first light-emitting element 201 is larger than the area S2 of the second light-emitting element 202, the proportions of the light-emitting elements 20 with different areas that are blocked by the light-blocking structure 30 at a large viewing angle may remain similar, balancing the difference of the white light characteristics of the light-emitting elements 20 with different areas at large viewing angles. Correspondingly, the uniformity of the white light characteristics of the display panel 000 at different viewing angles may be improved, to improve the display quality.

Figure 5:
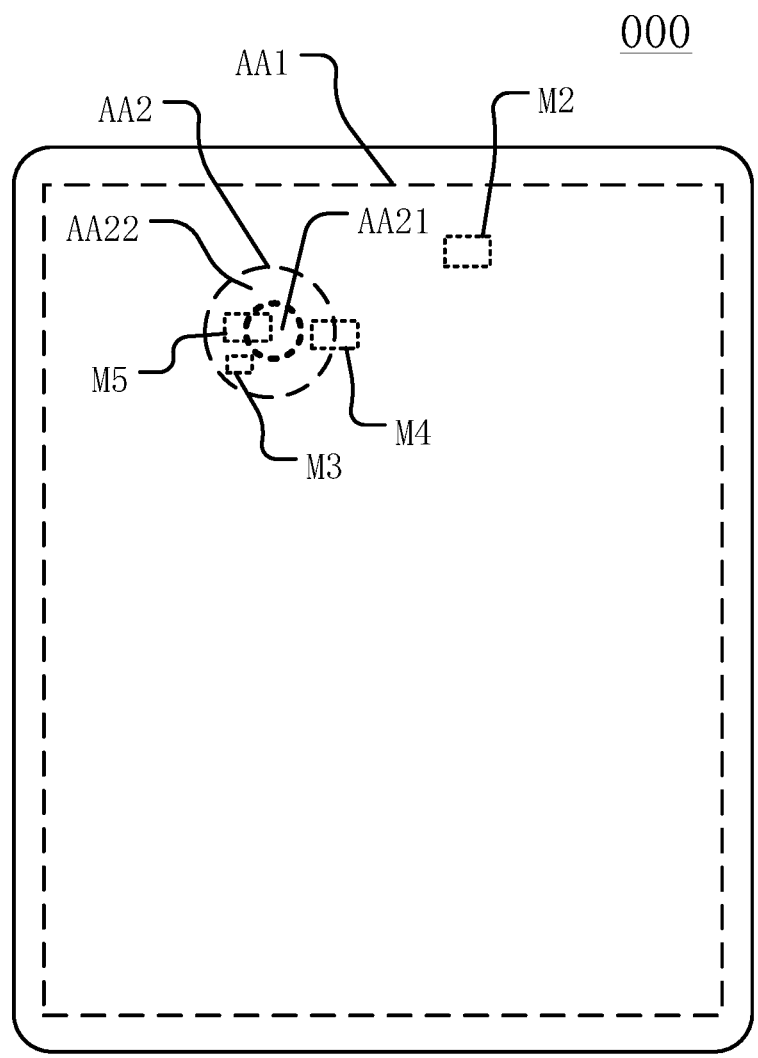
FIG. 5 illustrates another exemplary planar structure of a display panel consistent with various disclosed embodiments in the present disclosure.
Figure 6:
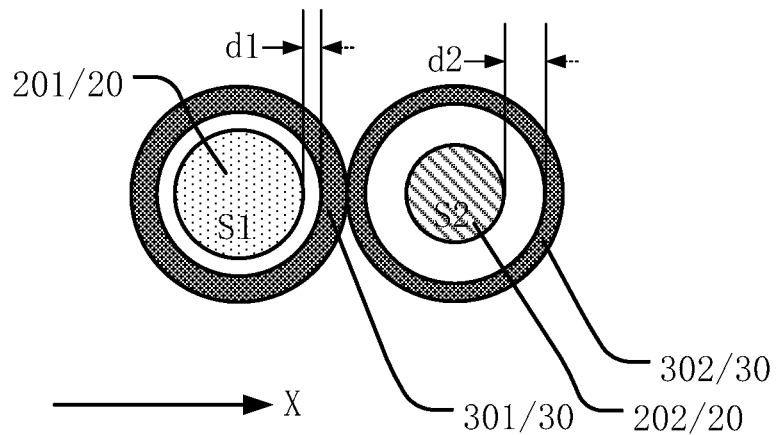
FIG. 6 illustrates a locally enlarged view of a M2 region in the display panel in FIG. 5 consistent with various disclosed embodiments in the present disclosure.
Figure 7:
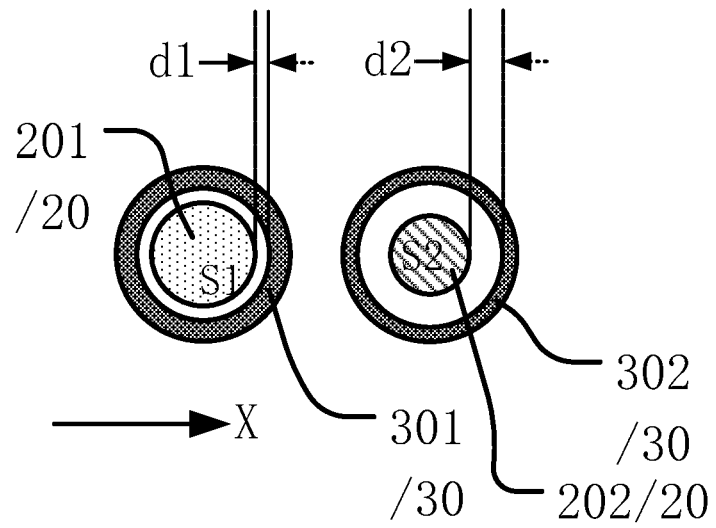
FIG. 7 illustrates a locally enlarged view of a M3 region in the display panel in FIG. 5 consistent with various disclosed embodiments in the present disclosure.

In some embodiments shown in FIG. 5 which is another planar structure of the display panel, FIG. 6 which is an enlarged view of the M2 region in FIG. 5, and FIG. 7 which is an enlarged view of the M3 region in FIG. 5, the display panel 000 may include a first display region AA1 and a second display region AA2. The transmittance of the first display region AA1 may be lower than the transmittance of the second display region AA2.

The colors of the first light-emitting elements 201 and the second light-emitting elements 202 may be different (different colors are distinguished by different filling patterns in the figure). The first light-emitting elements 201 and the second light-emitting elements 202 may be all located in the first display region AA1. In another embodiment, the first light-emitting elements 201 and the second light-emitting elements 202 may be all located in the second display region AA2.

In existing technologies, with the continuous development of display technology, a full screen using a camera under panel (CUP) area has become a new development trend. To ensure the photographing effect of the camera under panel area (CUP area), it is necessary to increase its transmittance to meet the amount of incoming light of photographing. Therefore, in the present disclosure, the display panel 000 may include a first display region AA1 and a second display region AA2. The transmittance of the first display region AA1 may be smaller than the transmittance of the second display region AA2, that is, the light transmittance of the second display region AA2 may be relatively high. Optionally, the first display region AA1 may be arranged at least partially around the second display region AA2. Optionally, while the second display region AA2 is used as a display region, it may also be used as a setting area corresponding to a photosensitive element, that is, the second display region AA2 may be used as the camera under panel area (CUP area) because of its high light transmittance. When the second display region AA2 is used as the setting area of the photosensitive element, it may need to have a higher transmittance, and correspondingly the higher transmittance may be achieved by setting the area of the light-transmitting area of the second display region AA2 to be larger than that of the first display region AA1. In some other embodiments, when the display panel 000 does not use the photosensitive element, the plurality of sub-pixels in the first display region AA1 and the second display region AA2 may display the screen normally together. When it is necessary to use the photosensitive element, for example, when it is necessary to use the camera for photographing, the larger light-transmitting area of the second display region AA2 may enable external light to enter the camera for imaging and shooting.

For a display panel with a camera under panel area, whether in the first display region AA1 used as the normal display region or the second display region AA2 used as the camera under panel area, the different lifespan of the luminescent materials of different light-emitting elements on the display panel, the functions undertaken by the regions where different light-emitting elements are located, and the light-emitting colors of different light-emitting elements may have different effects on the display effect. Therefore, the display panels in the first display region AA1 may have different white light characteristics at a specific viewing angle, which easily affects the uniformity of the white light characteristics of the display panel in the first display region AA1 under different viewing angles and the display quality of the display panel. Therefore, how to improve the brightness distribution difference of white light in the first display region AA1 under a large viewing angle to improve the display uniformity of the entire first display region AA1, and how to improve the brightness distribution difference of white light in the second display region AA2 under a large viewing angle to improve the display uniformity in the entire second display region AA2, such that the display panel as a whole has better display uniformity, are problems to be solved.

As shown in FIG. 5 and FIG. 6, in one embodiment, the first light-emitting elements 201 and the second light-emitting elements 202 may all be located in the first display region AA1, and the colors of the first light-emitting elements 201 and the second light-emitting elements 202 may be different. That is, the first light-emitting elements 201 and the second light-emitting elements 202 may all be light-emitting elements 20 with different colors in the first display region AA1 of the normal display region. The colors of the first light-emitting elements 201 and the second light-emitting elements 202 are different, and the area S1 of the orthographic projection of one first light-emitting element 201 on the substrate 10 may be larger than the area S2 of the orthographic projection of one second light-emitting element 202 on the substrate 10. For example, the light-emitting color of the first light-emitting elements 201 may be blue or green, and the light-emitting color of the second light-emitting elements 202 may be red. Along the first direction X, the distance d1 from the first light-blocking structure 301 to the corresponding first light-emitting element 201 may be smaller than the distance d2 from the second light-blocking structure 302 to the corresponding second light-emitting element 202. That is, the first light-blocking structure 301 may be closer to the edge of the corresponding first light-emitting element 201, and may block more light-emitting range of the corresponding first light-emitting element 201 with a larger area. The distance d2 from the second light-blocking structure 302 to the corresponding second light-emitting element 202 may be larger. That is, the second light-blocking structure 302 may be further away from the edge position of the corresponding second light-emitting element 202, and may block less light-emitting range of the second light-emitting element 202 with a smaller area. Therefore, even the area S1 of the first light-emitting element 201 is larger than the area S2 of the second light-emitting element 202 which is located in the first display region AA1 together with the first light-emitting element 201, the proportions of the light-emitting elements 20 with different areas that are blocked by the light-blocking structure 30 at a large viewing angle in the first display region AA1 may remain similar, balancing the difference of the white light characteristics of the light-emitting elements 20 with different areas at large viewing angles in the first display region AA1. Correspondingly, the uniformity of the white light characteristics of the first display region AA1 in the display panel 000 at different viewing angles may be improved, to improve the display quality.

For description purposes only, the above embodiments where the light-emitting color of the first light-emitting elements 201 may be blue or green and the light-emitting color of the second light-emitting elements 202 may be red are used as examples to illustrate the present disclosure, and do not limit the scope of the present disclosure. In some other embodiments, the light-emitting color of the first light-emitting elements 201 may be red, and the light-emitting color of the second light-emitting elements 202 may be blue or green. The present disclosure has no limit on this.

In another embodiment, as shown in FIG. 5 and FIG. 6, the first light-emitting elements 201 and the second light-emitting elements 202 may all be located in the second display region AA2, and the colors of the first light-emitting elements 201 and the second light-emitting elements 202 may be different. That is, the first light-emitting elements 201 and the second light-emitting elements 202 may all be light-emitting elements 20 with different colors in the second display region AA2 of the normal display region. The colors of the first light-emitting elements 201 and the second light-emitting elements 202 are different, and the area S1 of the orthographic projection of one first light-emitting element 201 on the substrate 10 may be larger than the area S2 of the orthographic projection of one second light-emitting element 202 on the substrate 10. For example, the light-emitting color of the first light-emitting elements 201 may be blue or green, and the light-emitting color of the second light-emitting elements 202 may be red. Along the first direction X, the distance d1 from the first light-blocking structure 301 to the corresponding first light-emitting element 201 may be smaller than the distance d2 from the second light-blocking structure 302 to the corresponding second light-emitting element 202. That is, the first light-blocking structure 301 may be closer to the edge of the corresponding first light-emitting element 201, and may block more light-emitting range of the corresponding first light-emitting element 201 with a larger area. The distance d2 from the second light-blocking structure 302 to the corresponding second light-emitting element 202 may be larger. That is, the second light-blocking structure 302 may be further away from the edge position of the corresponding second light-emitting element 202, and may block less light-emitting range of the second light-emitting element 202 with a smaller area. Therefore, even the area S1 of the first light-emitting element 201 is larger than the area S2 of the second light-emitting element 202 which is located in the second display region AA2 together with the first light-emitting element 201, the proportions of the light-emitting elements 20 with different areas that are blocked by the light-blocking structure 30 at a large viewing angle in the second display region AA2 may remain similar, balancing the difference of the white light characteristics of the light-emitting elements 20 with different areas at large viewing angles in the second display region AA2. Correspondingly, the uniformity of the white light characteristics of the second display region AA2 in the display panel 000 at different viewing angles may be improved, to improve the display quality.

Figure 8:
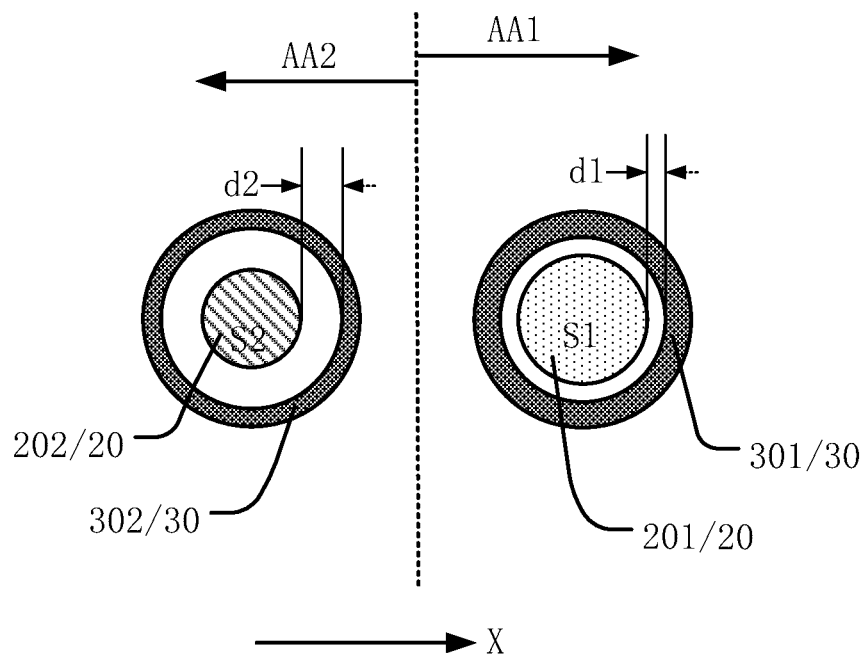
FIG. 8 illustrates a locally enlarged view of a M4 region in the display panel in FIG. 5 consistent with various disclosed embodiments in the present disclosure.
Figure 9:
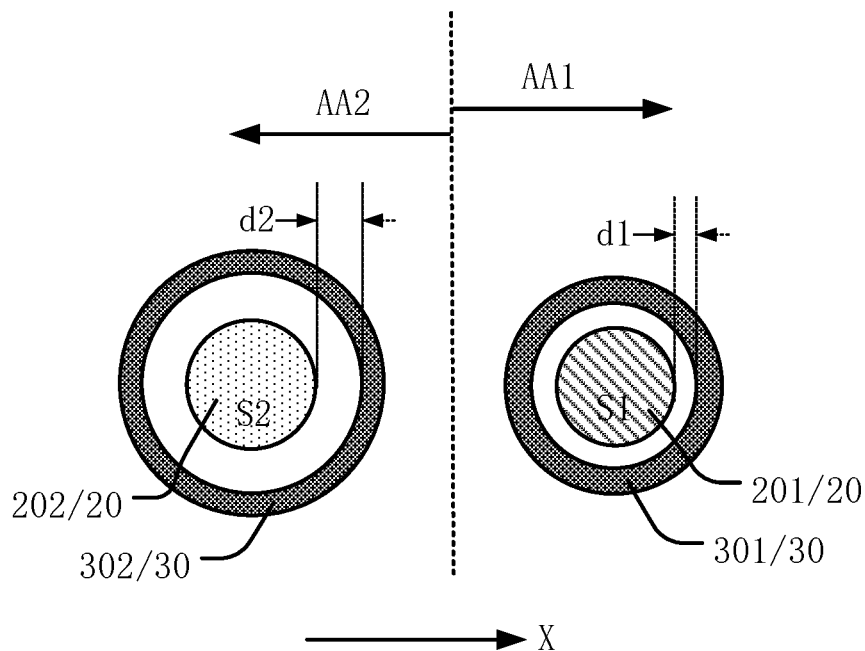
FIG. 9 illustrates another locally enlarged view of the M4 region in the display panel in FIG. 5 consistent with various disclosed embodiments in the present disclosure.

In some embodiments shown in FIG. 5, FIG. 8 which is an enlarged view of the M4 region in FIG. 5, and FIG. 9 which is another enlarged view of the M4 region in FIG. 5, the first light-emitting elements 201 may be located in the first display region AA1, and the second light-emitting elements 202 may be located in the second display region AA2, and the colors of the first light-emitting elements 201 and the second light-emitting elements 202 may be different. That is, the first light-emitting elements 201 and the second light-emitting elements 202 may be light-emitting elements 20 with different colors in the first display region AA1 of the normal display region and the second display region AA2 of the camera under panel area respectively. In one embodiment shown in FIG. 8, the light-emitting color of the first light-emitting elements 201 may be blue or green in the first display region AA1, and the light-emitting color of the second light-emitting elements 202 may be red in the second display region AA2. In another embodiment shown in FIG. 9, the light-emitting color of the first light-emitting elements 201 may be red in the first display region AA1, and the light-emitting color of the second light-emitting elements 202 may be blue or green in the second display region AA2. To ensure that the transmittance of the second display region AA2 is larger than the transmittance of the first display region AA1, the area of one light-emitting element 20 in the first display region AA1 may be larger than the area of one light-emitting element 20 in the second display region AA2 with a same color. As shown in FIG. 8, in one embodiment, when the light-emitting color of the first light-emitting elements 201 may be blue in the first display region AA1 and the light-emitting color of the second light-emitting elements 202 may be red in the second display region AA2, the area S1 of the orthographic projection of one first light-emitting element 201 on the substrate 10 may be larger than the area S2 of the orthographic projection of one second light-emitting element 202 on the substrate 10, and along the first direction X, the distance d1 from the first light-blocking structure 301 to the corresponding first light-emitting element 201 may be smaller than the distance d2 from the second light-blocking structure 302 to the corresponding second light-emitting element 202. As shown in FIG. 9, in another embodiment, when the light-emitting color of the first light-emitting elements 201 may be red in the first display region AA1 and the light-emitting color of the second light-emitting elements 202 may be blue in the second display region AA2, the area S1 of the orthographic projection of one first light-emitting element 201 on the substrate 10 may be slightly smaller than the area S2 of the orthographic projection of one second light-emitting element 202 on the substrate 10, and along the first direction X, the distance d1 from the first light-blocking structure 301 to the corresponding first light-emitting element 201 may be smaller than the distance d2 from the second light-blocking structure 302 to the corresponding second light-emitting element 202. That is, the first light-blocking structure 301 may be closer to the edge of the corresponding first light-emitting element 201, and may block more light-emitting range of the corresponding first light-emitting element 201 with a relatively smaller area. The transmittance of the second display region AA2 may be ensured to be high, to improve the photosensitive effect of the second display region AA2 when being used as the camera under panel area.

Figure 10:
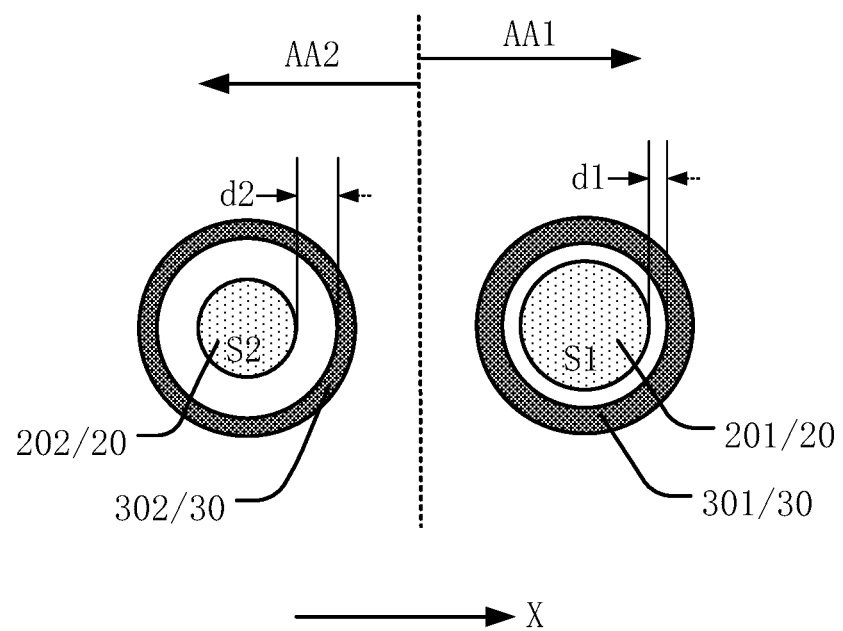
FIG. 10 illustrates another locally enlarged view of the M4 region in the display panel in FIG. 5 consistent with various disclosed embodiments in the present disclosure.

In some embodiments shown in FIG. 5 and FIG. 10 which is another enlarged view of the M4 region in FIG. 5, the display panel 000 may include a first display region AA1 and a second display region AA2. The transmittance of the first display region AA1 may be lower than the transmittance of the second display region AA2.

The colors of the first light-emitting elements 201 and the second light-emitting elements 202 may be same (same colors are represented by same filling patterns in the figure). The first light-emitting elements 201 may be located in the first display region AA1, and the second light-emitting elements 202 may be located in the second display region AA2.

The display panel 000 may include a first display region AA1 and a second display region AA2. The transmittance of the first display region AA1 may be smaller than the transmittance of the second display region AA2, that is, the light transmittance of the second display region AA2 may be relatively high. Optionally, the first display region AA1 may be arranged at least partially around the second display region AA2. Optionally, while the second display region AA2 is used as a display region, it may also be used as a setting area corresponding to a photosensitive element, that is, the second display region AA2 may be used as the camera under panel area (CUP area) because of its high light transmittance. When the second display region AA2 is used as the setting area of the photosensitive element, it may need to have a higher transmittance, and correspondingly the higher transmittance may be achieved by setting the area of the light-transmitting area of the second display region AA2 to be larger than that of the first display region AA1. In some other embodiments, when the display panel 000 does not use the photosensitive element, the plurality of sub-pixels in the first display region AA1 and the second display region AA2 may display the screen normally together. When it is necessary to use the photosensitive element, for example, when it is necessary to use the camera for photographing, the larger light-transmitting area of the second display region AA2 may enable external light to enter the camera for imaging and shooting.

In some embodiments shown in FIG. 5 and FIG. 10 which is another enlarged view of the M4 region in FIG. 5, the first light-emitting elements 201 may be located in the first display region AA1, and the second light-emitting elements 202 may be located in the second display region AA2, and the colors of the first light-emitting elements 201 and the second light-emitting elements 202 may be same. That is, the first light-emitting elements 201 and the second light-emitting elements 202 may be light-emitting elements 20 with same colors in the first display region AA1 of the normal display region and the second display region AA2 of the camera under panel area respectively. In one embodiment shown in FIG. 8, the light-emitting color of the first light-emitting elements 201 may be any one of red, blue or green in the first display region AA1, and the light-emitting color of the second light-emitting elements 202 may be any one of red, blue or green in the second display region AA2 but same as the first light-emitting elements 201. To ensure that the transmittance of the second display region AA2 is larger than the transmittance of the first display region AA1, for the first light-emitting elements 201 and the second light-emitting elements 202 with same colors, the area S1 of the orthographic projection of one first light-emitting element 201 on the substrate 10 may be larger than the area S2 of the orthographic projection of one second light-emitting element 202 on the substrate 10. Different areas of the different light-emitting elements may have different effects on the display effect. Therefore, the light-emitting elements with same colors in the first display region AA1 and in the second display region AA2 may have different white light characteristics at a specific viewing angle, which easily affects the uniformity of the white light characteristics of the display panel in the first display region AA1 under different viewing angles and the display quality of the display panel. In one embodiment, the area S1 of the orthographic projection of one first light-emitting element 201 on the substrate 10 may be larger than the area S2 of the orthographic projection of one second light-emitting element 202 on the substrate 10, and along the first direction X, the distance d1 from the first light-blocking structure 301 to the corresponding first light-emitting element 201 may be smaller than the distance d2 from the second light-blocking structure 302 to the corresponding second light-emitting element 202. That is, the first light-blocking structure 301 in the first display region AA1 may be closer to the edge of the corresponding first light-emitting element 201, and may block more light-emitting range of the corresponding first light-emitting element 201 with a larger area. The distance d2 from the second light-blocking structure 302 to the corresponding second light-emitting element 202 may be larger. That is, the second light-blocking structure 302 in the second display region AA2 may be further away from the edge position of the corresponding second light-emitting element 202, and may block less light-emitting range of the second light-emitting element 202 with a smaller area. Therefore, even the areas of the first light-emitting element 201 and the second light-emitting element 202 with same colors are different, the proportions of the light-emitting elements 20 with different areas but same colors that are blocked by the light-blocking structure 30 at a large viewing angle in the first display region AA1 and the second display region AA2 may remain similar, balancing the difference of the white light characteristics of the light-emitting elements 20 with different areas at large viewing angles in the second display region AA2. Correspondingly, the uniformity of the white light characteristics of the second display region AA2 in the display panel 000 at different viewing angles may be improved, to improve the display quality.

Figure 11:
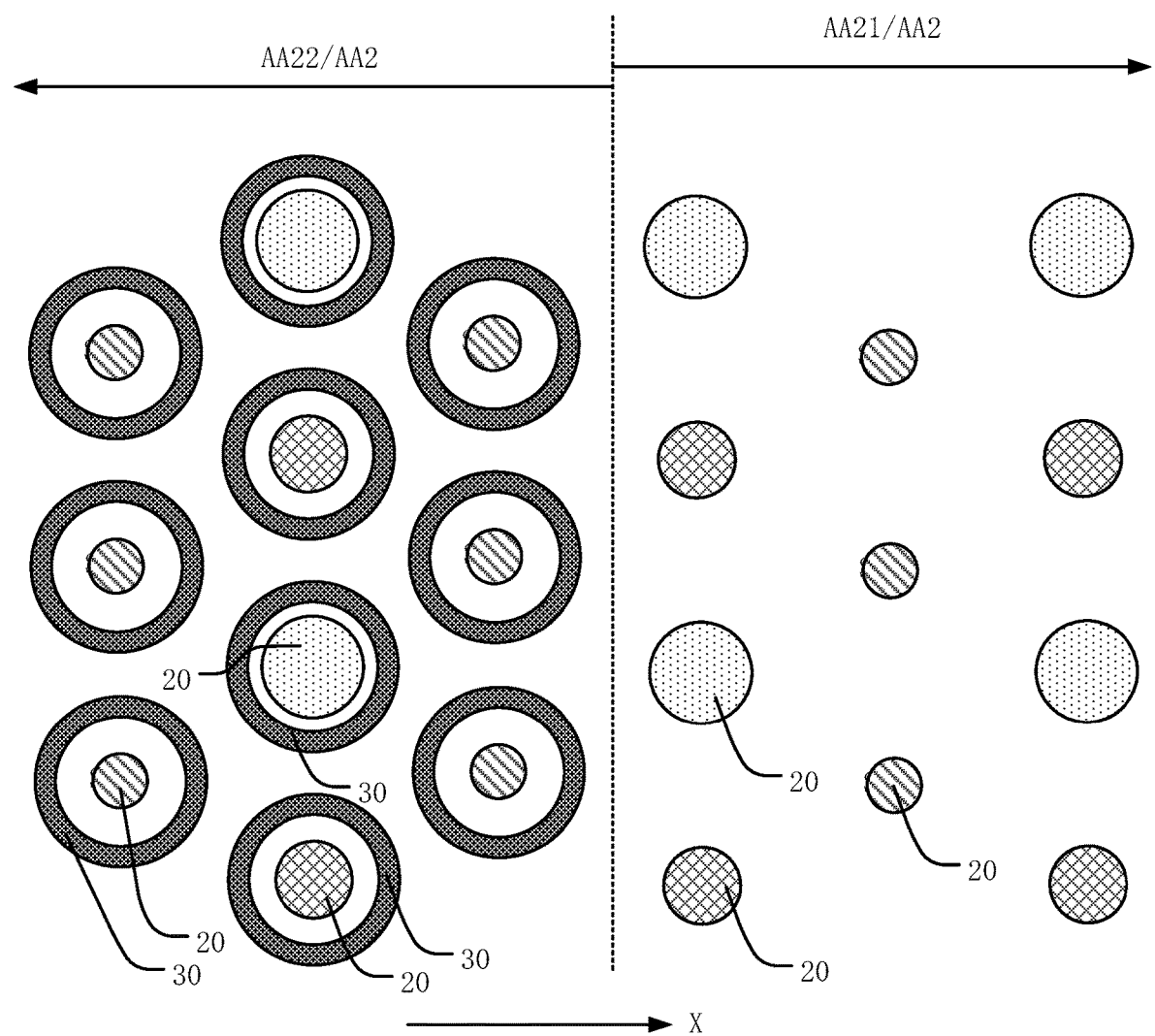
FIG. 11 illustrates a locally enlarged view of an M5 region in the display panel in FIG. 5 consistent with various disclosed embodiments in the present disclosure.
Figure 12:
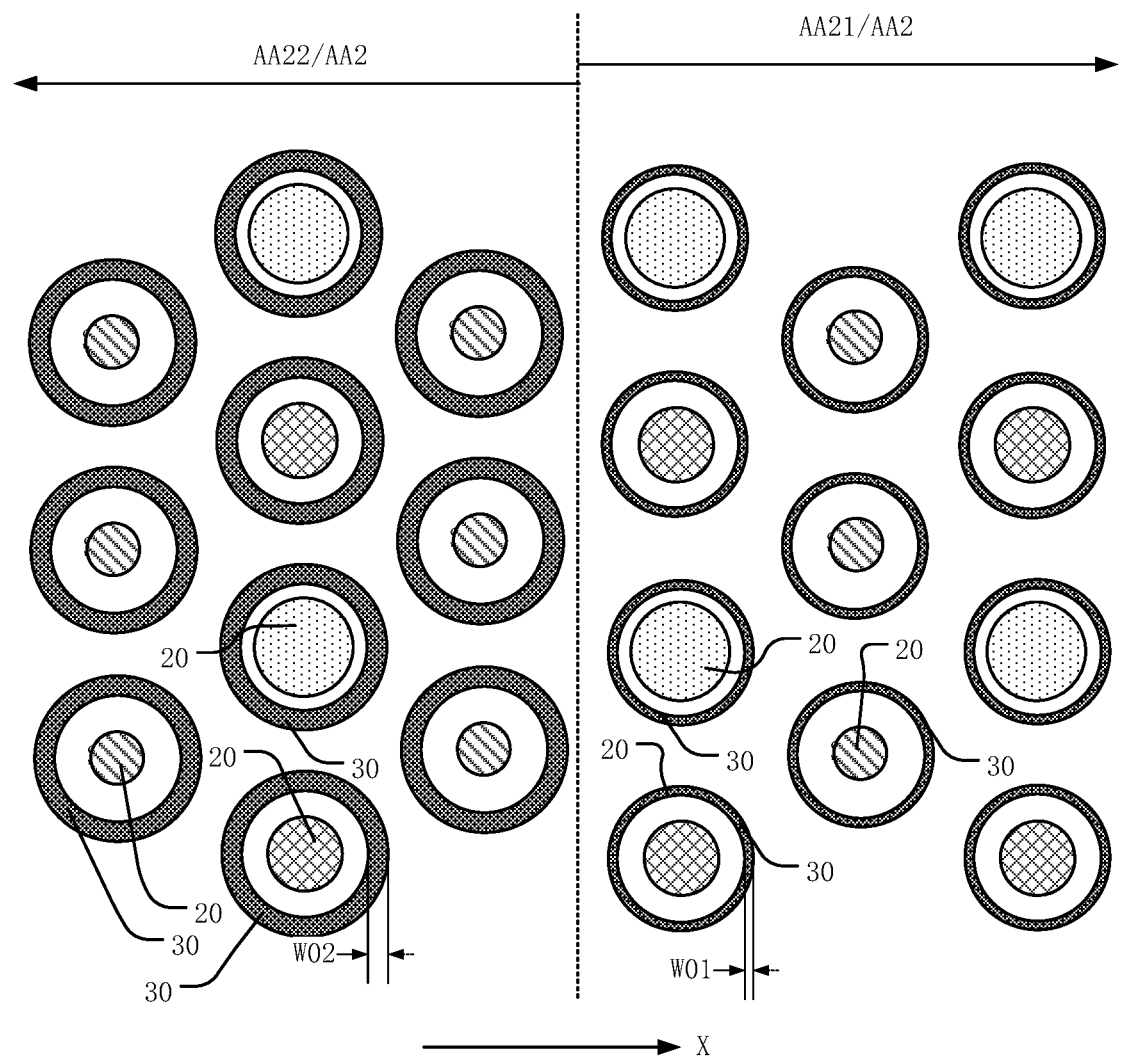
FIG. 12 illustrates another locally enlarged view of the M5 region in the display panel in FIG. 5 consistent with various disclosed embodiments in the present disclosure.

In some embodiments shown in FIG. 5, FIG. 11 which is an enlarged view of the M5 region in FIG. 5, and FIG. 12 which is another enlarged view of the M4 region in FIG. 5, the display panel 000 may include a first display region AA1 and a second display region AA2. The transmittance of the first display region AA1 may be lower than the transmittance of the second display region AA2.

The second display region AA2 may at least include a first region AA21 and a AA22 which at least partially surrounds the first region AA21. The transmittance of the first region AA21 may be larger than the transmittance of the second region AA22.

In the present embodiment, the display panel 000 may include a first display region AA1 and a second display region AA2. The transmittance of the first display region AA1 may be smaller than the transmittance of the second display region AA2, that is, the light transmittance of the second display region AA2 may be relatively high. Optionally, the first display region AA1 may be arranged at least partially around the second display region AA2. Optionally, while the second display region AA2 is used as a display region, it may also be used as a setting area corresponding to a photosensitive element, that is, the second display region AA2 may be used as the camera under panel area (CUP area) because of its high light transmittance. When the second display region AA2 is used as the setting area of the photosensitive element, it may need to have a higher transmittance, and correspondingly the higher transmittance may be achieved by setting the area of the light-transmitting area of the second display region AA2 to be larger than that of the first display region AA1. In some other embodiments, when the display panel 000 does not use the photosensitive element, the plurality of sub-pixels in the first display region AA1 and the second display region AA2 may display the screen normally together. When it is necessary to use the photosensitive element, for example, when it is necessary to use the camera for photographing, the larger light-transmitting area of the second display region AA2 may enable external light to enter the camera for imaging and shooting.

In the present embodiment, to ensure the high transmittance of the second display region AA2, the transmittance of different regions in the second display region AA2 may be designed to be different. Specifically, the second display region AA2 may at least include a first region AA21 and a AA22 which at least partially surrounds the first region AA21. The transmittance of the first region AA21 may be larger than the transmittance of the second region AA22. In the actual design of the display panel 000, it is desirable that the transmittance of the second display region AA2 used as the camera under panel area be as high as possible. To improve the difference in white light characteristics of the second display region AA2 under a large viewing angle, the second display region AA2 may also need to be provided with a light-blocking structure 30. When the user observes the display panel, the white light difference at a specific viewing angle perceived by the user may be easy to observe under the large viewing angle of the display panel 000 and may not be perceived when viewed directly above the display panel 000. In the present embodiment, the second display region AA2 may include at least the first area AA21 and the second area AA22 arranged at least partially around the first area AA21. The transmittance of the first area AA21 may be larger than that of the second area AA22. That is, the transmittance of the first area AA21 near the middle area of the second display region AA2 may be set to be larger than the transmittance of the second area AA22 in the periphery of the second display region AA2, to further improve the overall transmittance of the second display region AA2 by increasing the transmittance of the first area AA21.

Optionally, as shown in FIG. 11, in the first area AA21, the light-blocking structures 30 may not be provided between at least some of the adjacent light-emitting elements 20, that is, the light-blocking structures 30 may be disposed between adjacent light-emitting elements 20 only in the second area AA22 at the periphery of the second display region AA2. Correspondingly, the overall transmittance of the second display region AA2 may be further improved by increasing the transmittance of the first area AA21, and the difference in white light characteristics under a large viewing angle of the second display region AA2, that is, when viewed obliquely, may be improved, too.

Optionally, as shown in FIG. 12, the width of the light-blocking structures 30 in the first area AA21 in the first direction X may be set as W01, and the width of the light-blocking structures 30 in the second area AA22 in the first direction X may be set as W02, where W01<W02. That is, both the first area AA21 and the second area AA22 in the second display region AA2 may be provided with the light-blocking structures 30, but the width W01 of the light-blocking structures 30 in the first area AA21 in the first direction X may be smaller than the width W02 of the light-blocking structures 30 in the second area AA22 in the first direction X. The width of the light-blocking structures 30 in the second area AA22 in the first direction X may be narrow. Correspondingly, the overall transmittance of the second display region AA2 may be further improved by increasing the transmittance of the first area AA21, and the difference in white light characteristics under a large viewing angle of the second display region AA2, that is, when viewed obliquely, may be improved, too.

The embodiments shown in FIG. 11 and FIG. 12 with the arrangement structure of the light-emitting elements 20 of different colors in the second display region AA2 in the display panel 000 are used as examples only, for illustrating that the width W01 of the light-blocking structures 30 in the first area AA21 in the first direction X may be smaller than the width W02 of the light-blocking structures 30 in the second area AA22 in the first direction X. In various embodiments, the arrangement structure of the light-emitting elements 20 of different colors in the second display region AA2 may include, but is not limited to, the above structures, but may be other structures. It only needs to satisfy that in the light-emitting elements 20 with different areas in the first direction X, the distances between the light-emitting elements 20 and their corresponding light-blocking structures 30 may be different, and the width W01 of the light-blocking structures 30 in the first area AA21 in the first direction X may be smaller than the width W02 of the light-blocking structures 30 in the second area AA22 in the first direction X, to ensure the high transmittance of the second display region AA2. The present disclosure has no limit on this.

Figure 13:
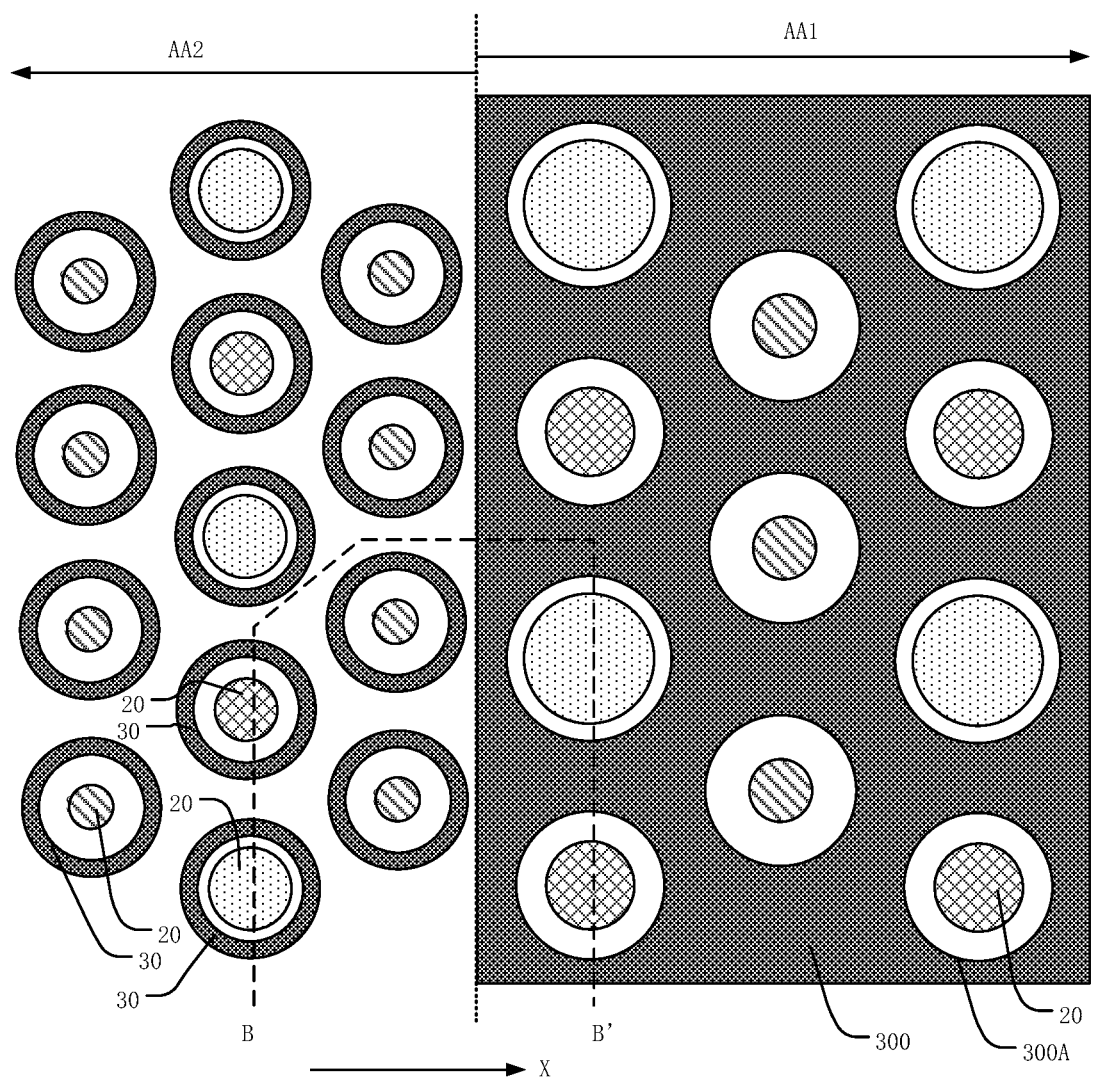
FIG. 13 illustrates another locally enlarged view of the M4 region in the display panel in FIG. 5 consistent with various disclosed embodiments in the present disclosure.
Figure 14:
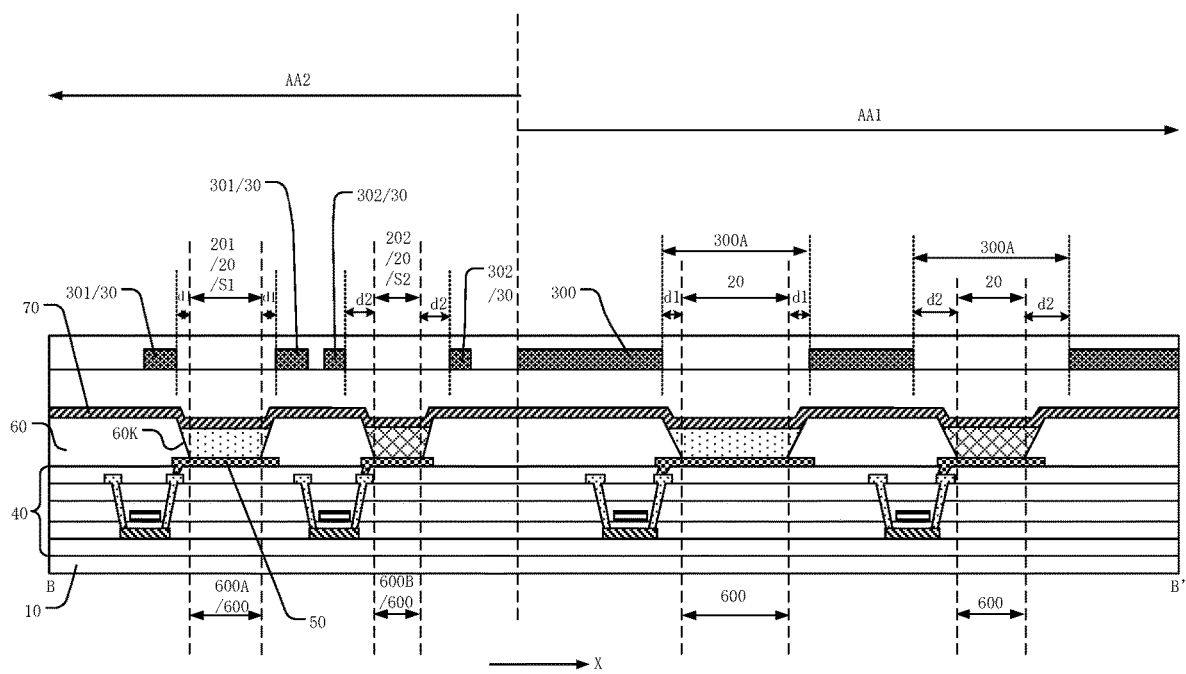
FIG. 14 illustrates a cross-sectional view of the M4 region in the display panel in FIG. 5 along a B-B' direction, consistent with various disclosed embodiments in the present disclosure.

In some embodiments shown in FIG. 5, FIG. 13 which is an enlarged view of the M4 region in FIG. 5, and FIG. 14 which is a cross-sectional view along the B-B' direction in FIG. 13, the display panel 000 may include a first display region AA1 and a second display region AA2. The transmittance of the first display region AA1 may be lower than the transmittance of the second display region AA2.

The display panel 000 may further include a light-blocking layer 300.

In the first display region AA1, the light-blocking layer 300 may include first hollow regions 300A. An orthographic projection of one first hollow region 300A on the substrate 10 may overlap one corresponding light-emitting element 20 in the first display region AA1.

The first light-emitting elements 201 and the second light-emitting elements 202 may be located in the second display region AA2. The first light-blocking structures 301 and the second light-blocking structures 302 may be independent from each other.

In the present embodiment, the display panel 000 may include a first display region AA1 and a second display region AA2. Optionally, the first display region AA1 may be arranged at least partially around the second display region AA2. Optionally, while the second display region AA2 is used as a display region, it may also be used as a setting area corresponding to a photosensitive element, that is, the second display region AA2 may be used as the camera under panel area (CUP area). The transmittance of the first display region AA1 may be smaller than the transmittance of the second display region AA2, that is, the light transmittance of the second display region AA2 may be relatively high. In some other embodiments, when the display panel 000 does not use the photosensitive element, the plurality of sub-pixels in the first display region AA1 and the second display region AA2 may display the screen normally together. When it is necessary to use the photosensitive element, for example, when it is necessary to use the camera for photographing, the larger light-transmitting area of the second display region AA2 may enable external light to enter the camera for imaging and shooting.

In the present embodiment, to ensure the high transmittance of the second display region AA2, the display panel 000 may be provided with a light-blocking layer 300. The light-blocking layer 300 may be disposed on a side of the cathode layer 70 in the display panel 000 away from the substrate 10, or the light-blocking layer 300 may also be disposed at other film positions on the side of the light-emitting material layers of the light-emitting elements 20 away from the substrate 10. The present disclosure does not specifically limit the position of the film layer where the light-blocking layer 300 is provided. In the first display region AA1, the light-blocking layer 300 includes first hollow areas 300A, and the orthographic projection of one first hollow area 300A on the substrate 10 may overlap one corresponding light-emitting element 20 in the first display region AA1. That is, one position where one first hollow area 300A is set in the first display region AA1 may be used for arranging one corresponding light-emitting elements 20 in the first display region AA1, such that one light-emitting element 20 in the first display region AA1 is able to emit light through the corresponding first hollow area 300A. The light-blocking layers 300 in the remaining positions of the first display region AA1 may be connected together as an integral structure for blocking light crosstalk between adjacent light-emitting elements 20. In the second display region AA2, the first light-emitting elements 201 and the second light-emitting elements 202 may be all located in the second display region AA2, and the first light-blocking structures 301 corresponding to the first light-emitting elements 201 and the second light-blocking structures 302 corresponding to the second light-emitting element 202 may be independent of each other. That is, the light-blocking structures 30 corresponding to the light-emitting elements 20 in the second display region AA2 may be independent structures, and may be not structurally connected to each other. Therefore, light-transmitting areas may be existed between different light-blocking structures 30 in the second display region AA2, which is beneficial to further improve the transmittance of the second display region AA2 of the display panel 000 and ensure the photosensitive effect when the photosensitive element is arranged in the second display region AA2.

In one embodiment, as shown in FIG. 14, the first light-blocking structures 301 and the second light-blocking structures 302 in the second display region AA2 may be disposed in the light-blocking layer 300, that is, the light-blocking structures between the light-emitting elements 20 in the first display region AA1 and the light-blocking structures in the second display region AA2 may be formed in the same layer using a same process. In some other embodiments, the first light-blocking structures 301 and the second light-blocking structures 302 in the second display region AA2 may be disposed by providing another light-blocking layer at a side of the light-emitting material layers of the light-emitting elements 20 away from the substrate 10. The present disclosure has no limit on this.

In some embodiments shown in FIG. 1 to FIG. 3, |S1−S2|>|d1−d2|.

In some embodiments, in the display panel 000, the area S1 of the orthographic projection of the first light-emitting element 201 on the substrate 10 may be different from the area S2 of the orthographic projection of the second light-emitting element 202 on the substrate 10, and the area of the orthographic projection of the first opening area 600A in the pixel definition layer 60 corresponding to the first light-emitting element 201 on the substrate 10 may be different from the area of the orthographic projection of the second opening area 600B in the pixel definition layer 60 corresponding to the second light-emitting element 202 on the substrate 10. Therefore, along the first direction X, the distance d1 from the first light-blocking structure 301 to the corresponding light-emitting element 201 may be also different from the distance d2 from the second light-blocking structure 302 to the corresponding second light-emitting element 202. The light emission of the sub-pixel corresponding to each light-emitting element 20 may mainly depend on the light-emitting area of the light-emitting element 20, that is, the area of the orthographic projection of one light-emitting element 20 on the substrate 10 may have large influence on the brightness and the color coordinates at a specific viewing angle of the sub-pixel where it is located. The relative brightness of the sub-pixel corresponding to each light-emitting element 20 after being blocked by the corresponding light-blocking structure 30 may have relatively small change. That is, compared with the influence of the light-blocking structures 30 on different light-emitting elements 20, the area of the orthographic projection of each light-emitting element 20 itself on the substrate 10 may have a larger impact on the light-emitting brightness. Therefore, in the present embodiment, along the direction parallel to the plane of the display panel 000, the change of the distances between two light-emitting elements 20 and their corresponding light-blocking structures 30 may be larger than the area change of the two light-emitting elements 20, that is, |S1−S2|>|d1−d2|. Optionally, when S1>S2, d1<d2, it may be S1−S2>d2−d1; or when S1>S2, d1>d2, it may be S1−S2>d1−d2. Correspondingly, according to the difference between the influence on the brightness and the color coordinates at a specific viewing angle of the sub-pixel where the light-emitting element 20 is located by the area of the light-emitting element 20 and the influence on the relative brightness by the light-blocking structure 30 blocking the corresponding light-emitting element 20, the difference in white light characteristics of different light-emitting elements 20 at a specific viewing angle may be adjusted mainly by changing the areas of the light-emitting elements 20. This configuration combined with the different configuration of the light-blocking structures may be used to make the distances between light-emitting elements 20 with different areas and their corresponding light-blocking structures 30 different, and adjust the difference in white light characteristics of different light-emitting elements 20 at specific viewing angles, such that the relative brightness of two light-emitting elements 20 with different areas after being blocked by the corresponding light-blocking structures 30 may be as consistent as possible. The viewing angle difference of the white light of the display panel 000 and the uniformity of the white light characteristics of the display panel 000 under different viewing angles may be improved, to improve the display quality of the display panel 000.

Figure 15:
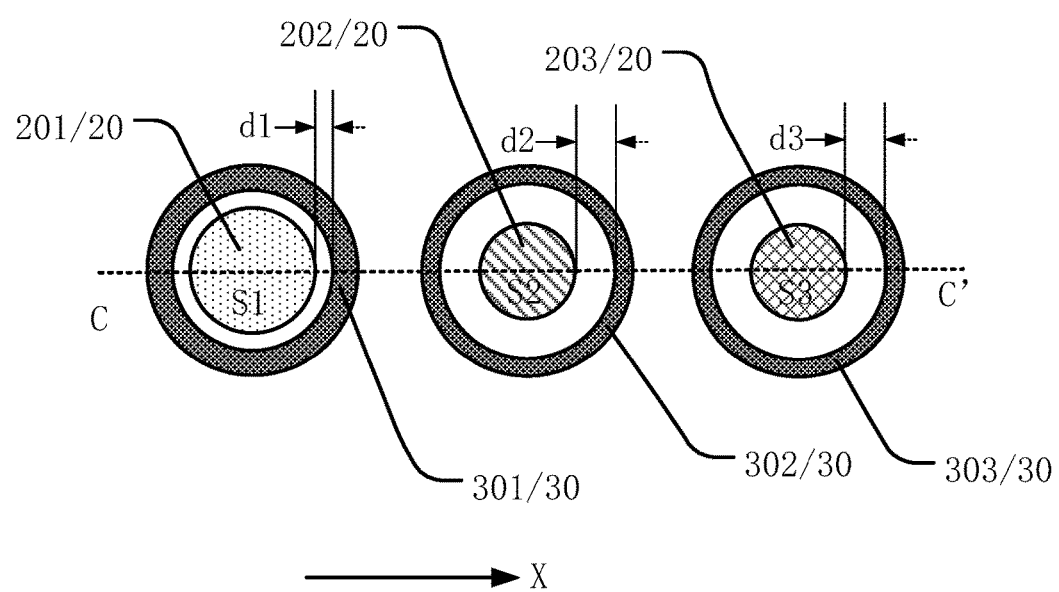
FIG. 15 illustrates another locally enlarged view of the M1 region in the display panel in FIG. 1 consistent with various disclosed embodiments in the present disclosure.
Figure 16:
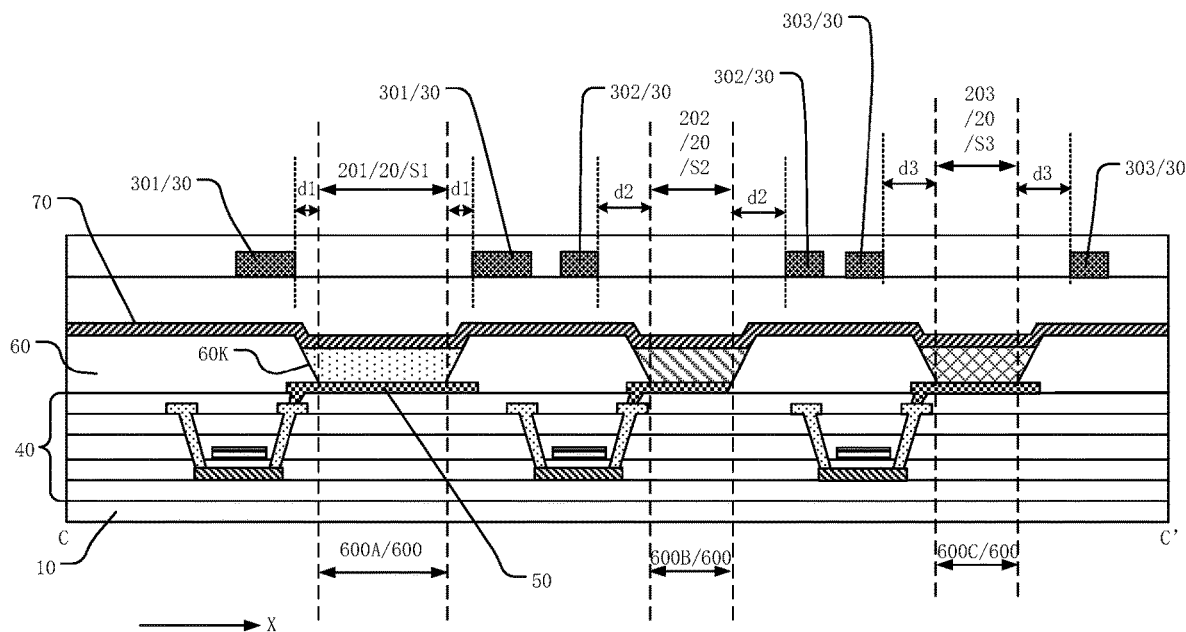
FIG. 16 illustrates a cross-sectional view of the display panel in FIG. 15 along a C-C' direction, consistent with various disclosed embodiments in the present disclosure.

In some embodiments shown in FIG. 1, FIG. 15 which is another enlarged view of the M1 region in FIG. 1, and FIG. 16 which is a cross-sectional view along the C-C' direction in FIG. 15, the light-emitting elements may further include third light-emitting elements 203. An area of an orthographic projection of one third light-emitting element 203 on the substrate 10 may be S3.

The light-blocking structures 30 may further include third light-blocking structures 303. An orthographic projection of one third light-blocking structure 303 may at least partially surround one corresponding third light-emitting element 203. Along the first direction X, a distance from one third light-blocking structure 303 to one corresponding third light-emitting element 203 may be d3, where S1>S3, d1<d3, and/or S2>S3, d2<d3.

One light-emitting element 20 may include one first light-emitting element 201, one second light-emitting element 202, and one third light-emitting element 203. The first light-emitting element 201, the second light-emitting element 202, and the third light-emitting element 203 may be light-emitting elements in the display panel 000 with different colors. The area of the orthographic projection of the first light-emitting element 201 on the substrate 10 may be S1, the area of the orthographic projection of the second light-emitting element 201 on the substrate 10 may be S2, and the area of an orthographic projection of the third light-emitting element 203 on the substrate 10 may be S3. The area S1 of the orthographic projection of the first light-emitting element 201 on the substrate 10 may be understood as an area of an orthographic projection of one first opening area 600A in the pixel definition layer 60 corresponding to the first light-emitting element 201, the area S2 of the orthographic projection of the second light-emitting element 202 on the substrate 10 may be understood as an area of an orthographic projection of one second opening area 600B in the pixel definition layer 60 corresponding to the second light-emitting element 202, and the area S3 of the orthographic projection of the third light-emitting element 203 on the substrate 10 may be understood as an area of an orthographic projection of a third opening area 600C in the pixel definition layer 60 corresponding to the third light-emitting element 203.

One opening area 600 of the pixel definition layer 60 may be formed by opening an opening 60K in the pixel definition layer 60 penetrating through the thickness of the pixel definition layer 60 itself. The cross-sectional shape of the opening 60K may be set according to actual needs. As shown in FIG. 16, in one embodiment, the cross-section may be an inverted trapezoid, and in this case, the range of the opening region 600 of the pixel definition layer 60 may be based on the bottom edge of the cross-section of the opening 60K whose shape is an inverted trapezoid.

The display panel 000 may further include the light-blocking structures 30 at the side of the light-emitting elements 20 away from the substrate 10. The light-blocking structures 30 may be disposed between different light-emitting elements 20 for blocking, to avoid light crosstalk between different light-emitting elements 20. Optionally, the light-blocking structures 30 may be located on the side of the cathode layer 70 away from the substrate 10. In some other optional embodiments, the light-blocking structures 30 may also be located in other film layers on the side of the light-emitting elements 20 away from the substrate 10. The present disclosure has no limit on this.

One light-blocking structure 30 may include one first light-blocking structure 301, one second light-blocking structure 302 and one third light-blocking structure 303. In one light-blocking structure 30, the first light-blocking structure 301 may correspond to one first light-emitting element 201. The orthographic projection of the first light-blocking structure 301 may at least partially surround the corresponding first light-emitting element 201 (not shown in the figure). In one embodiment, the orthographic projection of the first light-blocking structure 301 may surround the corresponding first light-emitting element 201, as shown in FIG. 15. In one light-blocking structure 30, the second light-blocking structure 302 may correspond to one second light-emitting element 202. The orthographic projection of the second light-blocking structure 302 may at least partially surround the corresponding second light-emitting element 202 (not shown in the figure). In one embodiment, the orthographic projection of the second light-blocking structure 302 may surround the corresponding second light-emitting element 202, as shown in FIG. 15. In one light-blocking structure 30, the third light-blocking structure 303 may correspond to one third light-emitting element 203. The orthographic projection of the third light-blocking structure 303 may at least partially surround the corresponding third light-emitting element 203 (not shown in the figure). In one embodiment, the orthographic projection of the third light-blocking structure 303 may surround the corresponding third light-emitting element 203, as shown in FIG. 15. That is, the first light-blocking structure 301 may be a least provided at a portion of the periphery of the first light-emitting element 201, the second light-blocking structure 302 may be at least provided at a portion of the periphery of the second light-emitting element 202, and the third light-blocking structure 303 may be at least provided at a portion of the periphery of the third light-emitting element 203. It can be understood that the present disclosure does not specifically limit the material of the light-blocking structures 30, and the material only needs to be opaque and be able to play a light-blocking role.

With the development of display technology, the lifespan of the light-emitting materials of different light-emitting elements on the display panel, the functions undertaken by the regions where different light-emitting elements are located, and the light-emitting colors of different light-emitting elements have different effects on the display effect. The white light characteristics of the panels at specific viewing angles are different, which in turn easily affects the uniformity of the white light characteristics of the display panel at different viewing angles and affects the display quality of the display panel. To solve the above problems, the display panel provided by the present disclosure may adjust different light-emitting elements to different degrees according to the display differences of different light-emitting elements, to ensure that the final display effect of the display panel is uniform and good. In existing technologies, the area of a general light-emitting element, that is, the area of the corresponding opening area of the pixel definition layer in the present disclosure, and the design of the light-blocking structures, are two factors that may significantly affect the values of relative brightness of each sub-pixel after being shielded by one corresponding light-blocking structure, the change of brightness and color coordinate of each sub-pixel under a specific viewing angle.

In the display panel 000 provided by the present disclosure, along the first direction X, a distance from the first light-blocking structure 301 to the corresponding first light-emitting element 201 may be d1. A distance from the second light-blocking structure 302 to the corresponding second light-emitting element 202 may be d2, where S1>S2 and d1<d2. Correspondingly, along the first direction X, a distance from the third light-blocking structure 303 to the corresponding third light-emitting element 203 may be d3, where S1>S3 and d1<d3, and/or S2>S3 and d2<d3. That is, the area S1 of the orthographic projection of the first light-blocking structure 301 on the substrate 10 may be different from the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different form the distance d2 between the second light-blocking structure 302 and the second light-emitting element 202. Therefore, the area S1 of the orthographic projection of the first light-blocking structure 301 on the substrate 10 may be different from the area S3 of the orthographic projection of the third light-blocking structure 303 on the substrate 10. The area of the orthographic projection of the first opening area 600A in the pixel definition layer corresponding to the first light-emitting element 201 on the substrate 10 may be different from the area of the orthographic projection of the third opening area 600C in the pixel definition layer corresponding to the third light-emitting element 203 on the substrate 10. Along the first direction X, the distance d1 between the first light-blocking structure 301 and the first light-emitting element 201 may be different form the distance d3 between the third light-blocking structure 303 and the third light-emitting element 203, as shown in FIG. 15 and FIG. 16.

In another embodiment, the area S1 of the orthographic projection of the first light-blocking structure 301 on the substrate 10 may be different from the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different from the distance d2 between the second light-blocking structure 302 and the second light-emitting element 202. Therefore, the area S2 of the orthographic projection of the second light-blocking structure 302 on the substrate 10 may be different from the area S3 of the orthographic projection of the third light-blocking structure 303 on the substrate 10. The area of the orthographic projection of the second opening area 600B in the pixel definition layer corresponding to the second light-emitting element 202 on the substrate 10 may be different from the area of the orthographic projection of the third opening area 600C in the pixel definition layer corresponding to the third light-emitting element 203 on the substrate 10. Along the first direction X, the distance d2 between the second light-blocking structure 302 and the first light-emitting element 201 may be different form the distance d3 between the third light-blocking structure 303 and the third light-emitting element 203 (not shown in the figure).

In another embodiment, the area S1 of the orthographic projection of the first light-blocking structure 301 on the substrate 10 may be different from the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different from the distance d2 between the second light-blocking structure 302 and the second light-emitting element 202. Therefore, the area S1 of the orthographic projection of the first light-blocking structure 301 on the substrate 10 may be different from the area S3 of the orthographic projection of the third light-blocking structure 303 on the substrate 10. The area of the orthographic projection of the first opening area 600A in the pixel definition layer corresponding to the first light-emitting element 201 on the substrate 10 may be different from the area of the orthographic projection of the third opening area 600C in the pixel definition layer corresponding to the third light-emitting element 203 on the substrate 10. Along the first direction X, the distance d1 between the first light-blocking structure 301 and the first light-emitting element 201 may be different form the distance d3 between the third light-blocking structure 303 and the third light-emitting element 203. The area S2 of the orthographic projection of the second light-blocking structure 302 on the substrate 10 may be different from the area S3 of the orthographic projection of the third light-blocking structure 303 on the substrate 10. The area of the orthographic projection of the second opening area 600B in the pixel definition layer corresponding to the second light-emitting element 202 on the substrate 10 may be different from the area of the orthographic projection of the third opening area 600C in the pixel definition layer corresponding to the third light-emitting element 203 on the substrate 10. Along the first direction X, the distance d2 between the second light-blocking structure 302 and the first light-emitting element 201 may be different form the distance d3 between the third light-blocking structure 303 and the third light-emitting element 203 (not shown in the figure).

In another embodiment shown in FIG. 15 and FIG. 16, the area S1 of the orthographic projection of the first light-blocking structure 301 on the substrate 10 may be larger than the area S2 of the orthographic projection of the second light-blocking structure 302 on the substrate 10, and the area S1 of the orthographic projection of the first light-blocking structure 301 on the substrate 10 may be larger than the area S3 of the orthographic projection of the third light-blocking structure 303 on the substrate 10. That is, the area of the orthographic projection of the first opening area 600A in the pixel definition layer corresponding to the first light-emitting element 201 on the substrate 10 may be larger than the area of the orthographic projection of the second opening area 600B in the pixel definition layer corresponding to the second light-emitting element 202 on the substrate 10, and larger than the area of the orthographic projection of the third opening area 600C in the pixel definition layer corresponding to the third light-emitting element 203 on the substrate 10. Along the first direction X, the distance d1 between the first light-blocking structure 301 and the first light-emitting element 201 may be smaller than the distance d2 between the second light-blocking structure 302 and the second light-emitting element 202, and smaller than the distance d3 between the third light-blocking structure 303 and the third light-emitting element 203.

Figure 17:
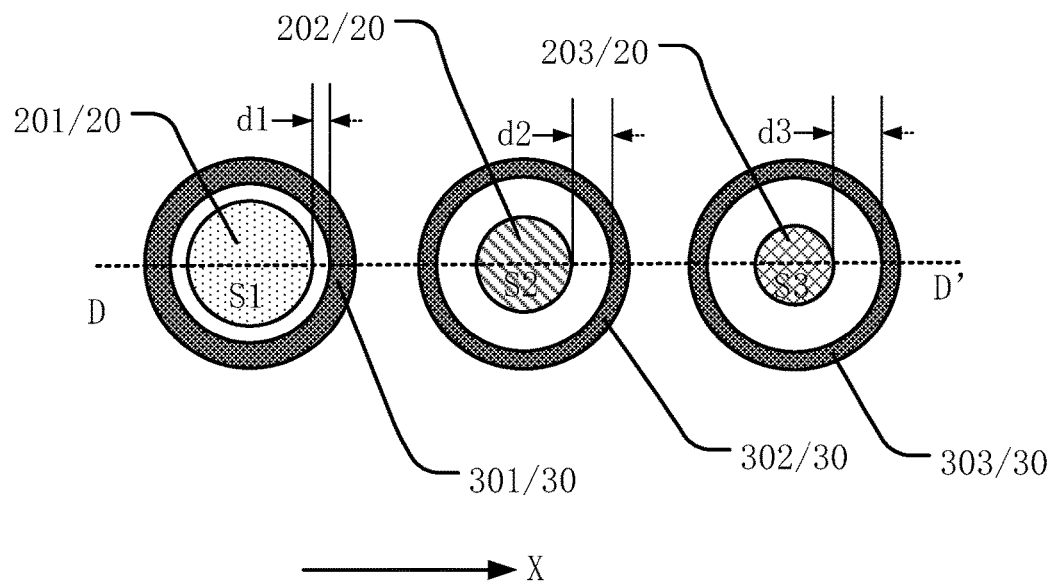
FIG. 17 illustrates another locally enlarged view of the M1 region in the display panel in FIG. 1 consistent with various disclosed embodiments in the present disclosure.
Figure 18:
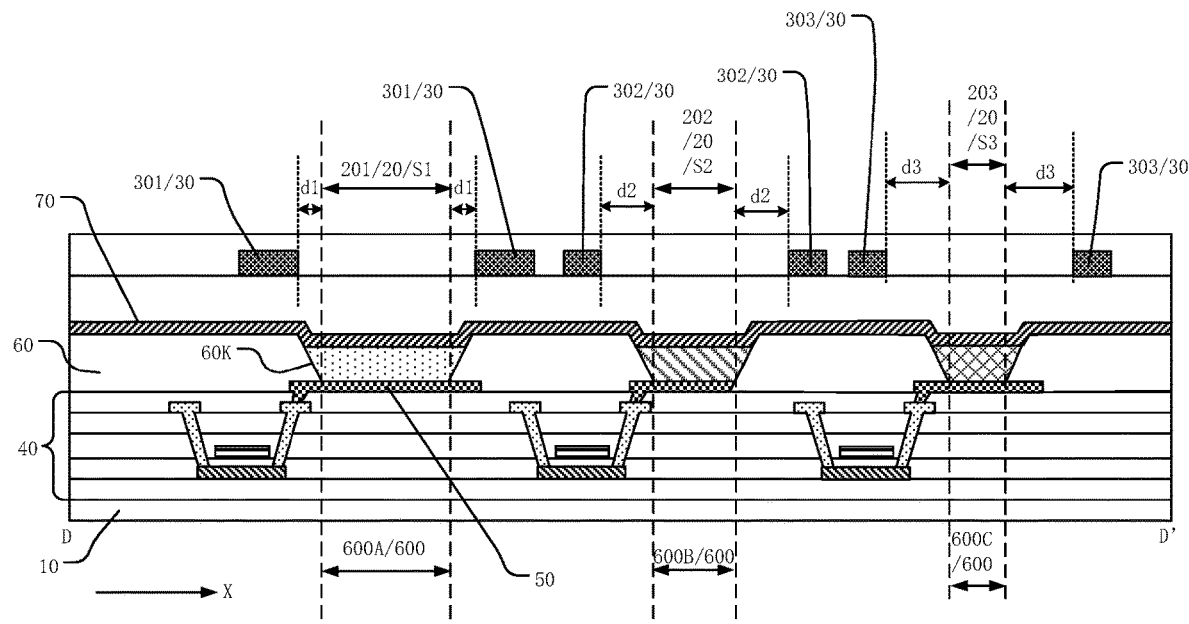
FIG. 18 illustrates a cross-sectional view of the display panel in FIG. 17 along a D-D' direction, consistent with various disclosed embodiments in the present disclosure.

In another embodiment shown in FIG. 1, FIG. 17 which is another enlarged view of the M1 region in FIG. 1, and FIG. 18 which is a cross-sectional view along the D-D' direction in FIG. 17, the area S1 of the orthographic projection of the first light-blocking structure 301 on the substrate 10 may be larger than the area S2 of the orthographic projection of the second light-blocking structure 302 on the substrate 10, and the area S2 of the orthographic projection of the second light-blocking structure 302 on the substrate 10 may be larger than the area S3 of the orthographic projection of the third light-blocking structure 303 on the substrate 10, that is S1>S2>S3. The area of the orthographic projection of the first opening area 600A in the pixel definition layer corresponding to the first light-emitting element 201 on the substrate 10 may be larger than the area of the orthographic projection of the second opening area 600B in the pixel definition layer corresponding to the second light-emitting element 202 on the substrate 10, and the area of the orthographic projection of the second opening area 600B in the pixel definition layer corresponding to the second light-emitting element 202 on the substrate 10 may be larger than the area of the orthographic projection of the third opening area 600C in the pixel definition layer corresponding to the third light-emitting element 203 on the substrate 10. Along the first direction X, the distance d1 between the first light-blocking structure 301 and the first light-emitting element 201 may be smaller than the distance d2 between the second light-blocking structure 302 and the second light-emitting element 202, and the distance d2 between the second light-blocking structure 302 and the second light-emitting element 202 may be smaller than the distance d3 between the third light-blocking structure 303 and the third light-emitting element 203, that is d1<d2<d3.

In the present disclosure, the area S1 of the orthographic projection of the first light-blocking structure 301 on the substrate 10 may be different from the area S2 of the orthographic projection of the second light-blocking structure 302 on the substrate 10. The area S3 of the orthographic projection of the third light-blocking structure 303 on the substrate 10 may be different from one of the area S1 of the orthographic projection of the first light-blocking structure 301 on the substrate 10 and the area S2 of the orthographic projection of the second light-blocking structure 302 on the substrate 10. The area of the orthographic projection of the first opening area 600A in the pixel definition layer corresponding to the first light-emitting element 201 on the substrate 10 may be different from the area of the orthographic projection of the second opening area 600B in the pixel definition layer corresponding to the second light-emitting element 202 on the substrate 10. The area of the orthographic projection of the third opening area 600C in the pixel definition layer corresponding to the third light-emitting element 203 on the substrate 10 may be different from one of the area of the orthographic projection of the first opening area 600A in the pixel definition layer corresponding to the first light-emitting element 201 on the substrate 10 and the area of the orthographic projection of the second opening area 600B in the pixel definition layer corresponding to the second light-emitting element 202 on the substrate 10. Along the first direction X, the distance d1 between the first light-blocking structure 301 and the first light-emitting element 201 may be different form the distance d2 between the second light-blocking structure 302 and the second light-emitting element 202. The distance d3 between the third light-blocking structure 303 and the third light-emitting element 203 may be different from one of the distance d1 between the first light-blocking structure 301 and the first light-emitting element 201 and the distance d2 between the second light-blocking structure 302 and the second light-emitting element 202. Therefore, for the light-emitting elements 20 with different areas, for example, for a light-emitting element 20 with a larger area, the distance between one light-emitting element 20 and its corresponding light-blocking structure 30 in the direction parallel to the plane of the display panel 000 may be designed to be larger or smaller. Correspondingly, although the areas of the light-emitting elements 20 in the display panel 000 are different, by adjusting the distance between one light-emitting element 20 and its corresponding light-blocking structure 30 in the direction parallel to the plane of the display panel 000, the relative brightness of two light-emitting elements 20 with different areas after being blocked by corresponding light-blocking structures 30 respectively may be kept consistent as much as possible, and the light-emitting brightness at a specific viewing angle may be also as consistent as possible. The display difference between different light-emitting elements 20 may be reduced, to improve the view angle difference of the white light of the display panel 000. The uniformity of white light characteristics of the display panel 000 under different viewing angles may be improved, thereby helping to improve the display quality of the display panel 000.

In one embodiment, the first light-emitting element 201 may be a blue light-emitting element, the second light-emitting element 202 may be a green light-emitting element, and the third light-emitting element 203 may be a red light-emitting element. In some other embodiments, the first light-emitting element 201 may be is a blue light-emitting element, the second light-emitting element 202 may be a red light-emitting element, and the third light-emitting element 203 may be a green light-emitting element. In some other optional embodiments, the first light-emitting element 201 may be a green light-emitting element, the second light-emitting element 202 may be a blue light-emitting element, and the third light-emitting element 203 may be a red light-emitting element. In some other optional embodiments, the first light-emitting element 201 may be a green light-emitting element, the second light-emitting element 202 may be a red light-emitting element, and the third light-emitting element 203 may be a blue light-emitting element. In some other optional embodiments, the first light-emitting element 201 may be a red light-emitting element, the second light-emitting element 202 may be a blue light-emitting element, and the third light-emitting element 203 may be green light-emitting elements. In some other optional embodiments, the first light-emitting element 201 may be a red light-emitting element, the second light-emitting element 202 may be a green light-emitting element, and the third light-emitting element 203 may be a blue light-emitting element. The present disclosure has no limit on this.

In some embodiments shown in FIG. 1, FIG. 17, and FIG. 18, $|(S1-S2)-(S2-S3)|>|(d1-d2)-(d2-d3)|$.

In some embodiments, in the display panel 000, the area S1 of the orthographic projection of the first light-emitting element 201 on the substrate 10 may be different from the area S2 of the orthographic projection of the second light-emitting element 202 on the substrate 10, and the area S2 of the orthographic projection of the second light-emitting element 202 on the substrate 10 may be different from the area S3 of the orthographic projection of the third light-blocking structure 303 on the substrate 10. The area of the orthographic projection of the first opening area 600A in the pixel definition layer 60 corresponding to the first light-emitting element 201 on the substrate 10 may be different from the area of the orthographic projection of the second opening area 600B in the pixel definition layer 60 corresponding to the second light-emitting element 202 on the substrate 10, and the area of the orthographic projection of the second opening area 600B in the pixel definition layer 60 corresponding to the second light-emitting element 202 on the substrate 10 may be different from the area of the orthographic projection of the third opening area 600C in the pixel definition layer corresponding to the third light-emitting element 203 on the substrate 10. Therefore, along the first direction X, the distance d1 from the first light-blocking structure 301 to the corresponding light-emitting element 201 may be also different from the distance d2 from the second light-blocking structure 302 to the corresponding second light-emitting element 202, and the distance d2 from the second light-blocking structure 302 to the corresponding second light-emitting element 202 may be different from distance d3 between the third light-blocking structure 303 and the third light-emitting element 203. The light emission of the sub-pixel corresponding to each light-emitting element 20 may mainly depend on the light-emitting area of the light-emitting element 20, that is, the area of the orthographic projection of one light-emitting element 20 on the substrate 10 may have large influence on the brightness and the color coordinates at a specific viewing angle of the sub-pixel where it is located. The relative brightness of the sub-pixel corresponding to each light-emitting element 20 after being blocked by the corresponding light-blocking structure 30 may have relatively small change. That is, compared with the influence of the light-blocking structures 30 on different light-emitting elements 20, the area of the orthographic projection of each light-emitting element 20 itself on the substrate 10 may have a larger impact on the light-emitting brightness. Therefore, in the present embodiment, along the direction parallel to the plane of the display panel 000, the change of the distances between two light-emitting elements 20 and their corresponding light-blocking structures 30 may be larger than the area change of the two light-emitting elements 20, that is, |(S1−S2)−(S2−S3)|>|(d1−d2)−(d2−d3)|. Optionally, when S1>S2>S3 and d1<d2<d3, it may be (S1−S2)−(S2−S3)>(d3−d2)−(d2−d1); or when S1>S2>S3 and d1>d2>d3, it may be (S1−S2)−(S2−S3)>(d1−d2)−(d2−d3). Correspondingly, according to the difference between the influence on the brightness and the color coordinates at a specific viewing angle of the sub-pixel where the light-emitting element 20 is located by the area of the light-emitting element 20 and the influence on the relative brightness by the light-blocking structure 30 blocking the corresponding light-emitting element 20, the difference in white light characteristics of different light-emitting elements 20 at a specific viewing angle may be adjusted mainly by changing the areas of the light-emitting elements 20. This configuration combined with the different configuration of the light-blocking structures may be used to make the distances between light-emitting elements 20 with different areas and their corresponding light-blocking structures 30 different, and adjust the difference in white light characteristics of different light-emitting elements 20 at specific viewing angles, such that the relative brightness of two light-emitting elements 20 with different areas after being blocked by the corresponding light-blocking structures 30 may be as consistent as possible. The viewing angle difference of the white light of the display panel 000 and the uniformity of the white light characteristics of the display panel 000 under different viewing angles may be improved, to improve the display quality of the display panel 000.

Figure 19:
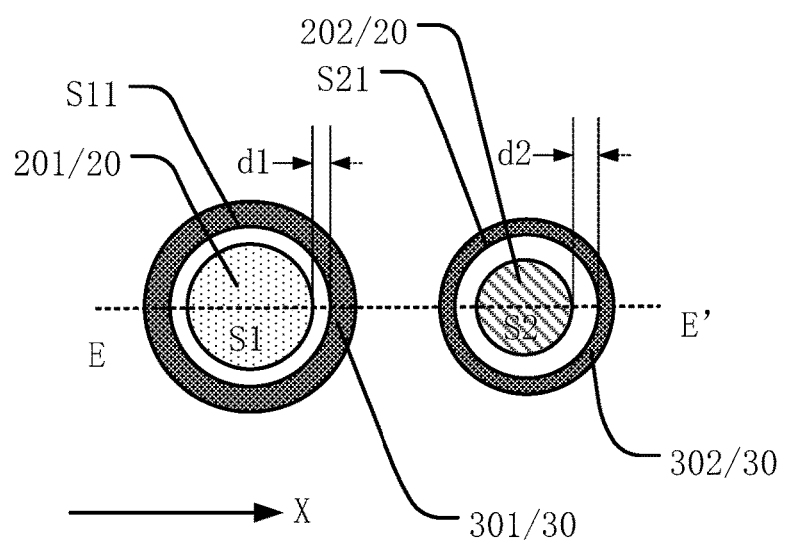
FIG. 19 illustrates another locally enlarged view of the M1 region in the display panel in FIG. 1 consistent with various disclosed embodiments in the present disclosure.
Figure 20:
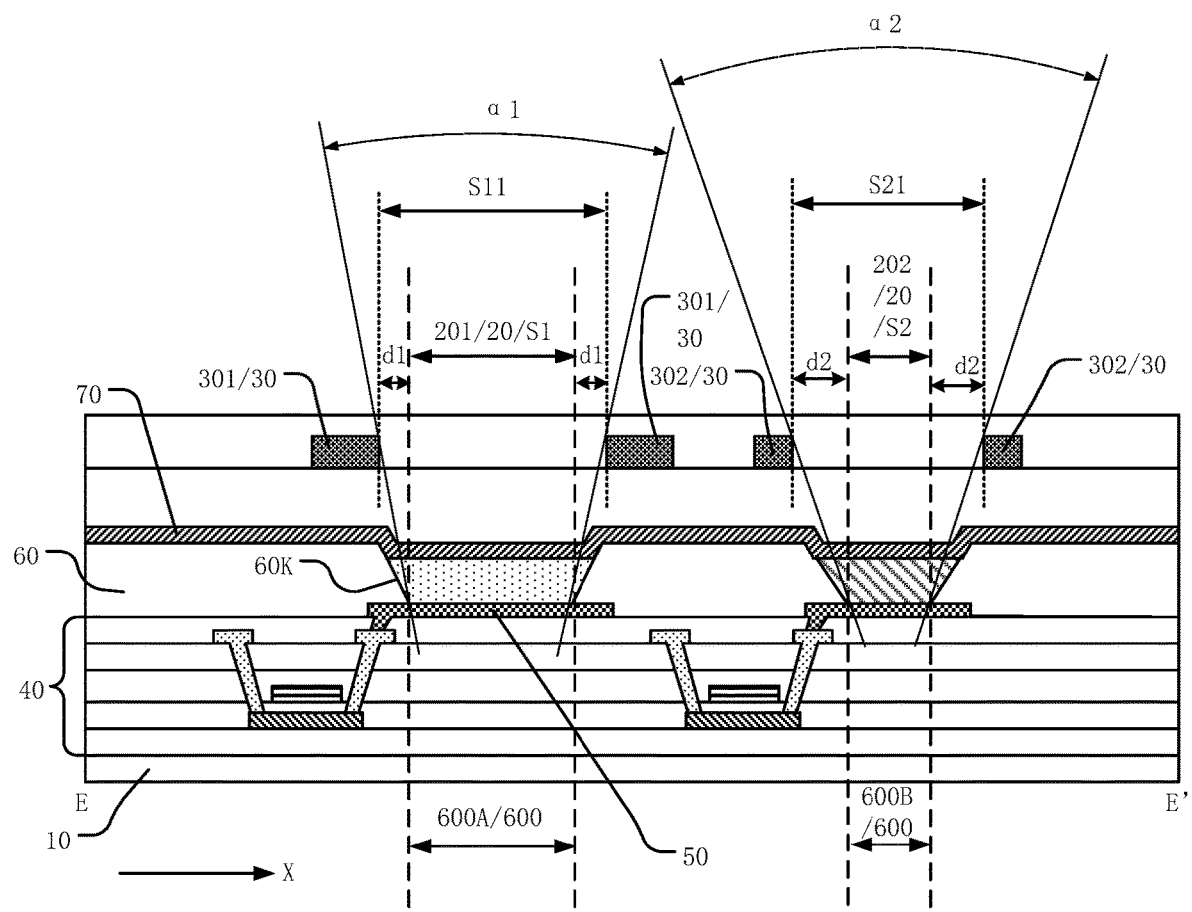
FIG. 20 illustrates a cross-sectional view of the display panel in FIG. 19 along an E-E' direction, consistent with various disclosed embodiments in the present disclosure.

In some embodiments shown in FIG. 1, FIG. 19 which is another enlarged view of the M1 region in FIG. 1, and FIG. 20 which is a cross-sectional view along the E-E' direction in FIG. 19, an orthographic projection of one first light-blocking structure 301 on the substrate 10 may surround one corresponding first light-emitting element 201, and an area of an opening formed by the first light-blocking structure 301 may be S11. An orthographic projection of one second light-blocking structure 302 on the substrate 10 may surround one corresponding second light-emitting element 202, and an area of an opening formed by the second light-blocking structure 302 may be S21, where S11>S21 and S11/S21=S1/S2.

In the display panel 000, one first light-blocking structure 301 is disposed at a side of one corresponding first light-emitting element 201 away from the substrate 10 and the orthographic projection of the first light-blocking structure 301 to block the light with a large viewing angle emitted by the first light-emitting element 201. At this time, the area of the opening formed by the first light-blocking structure 301 may be S11 (it can also be understood as the actual light-emitting area S11 of the first light-emitting element 201). One second light-blocking structure 302 may be disposed at a side of one corresponding second light-emitting element 202 away from the substrate 10 and the orthographic projection of the second light-blocking structure 302 on the substrate 10 may surround the corresponding second light-emitting element 202 to block the light with a large viewing angle emitted by the second light-emitting element 202. At this time, the area of the opening formed by the second light-blocking structure 302 may be S21 (it can also be understood as the actual light-emitting area S21 of the second light-emitting element 202). After the first light-emitting element 201 and the second light-emitting element 202 with different areas are shielded by the first light-blocking structure 301 and the second light-blocking structure 302 respectively, the opening area S11 formed by the first light-blocking structure 301 which is the actual light-emitting area of the first light-emitting element 201 may be larger than the opening area S21 formed by the second light-blocking structure 302 which is the actual light-emitting area S21 of the second light-emitting element 202. Assuming that the first light-emitting element 201 and the second light-emitting element 202 are two light-emitting elements 20 of different colors and the area S1 of the first light-emitting element 201 is larger than the area S2 of the second light-emitting element 202, when the first light-emitting element 201 and the second light-emitting element 202 are viewed from the same large viewing angle, the first light-emitting element 201 may be blocked by the first light-blocking structure 301 and the second light-emitting element 202 may be blocked by the second light-blocking structure 302. The relative brightness of the first light-emitting element 201 and the second light-emitting element 20 the two light-emitting elements 20 may be different after each is blocked by its corresponding light-blocking structure 30. In the present disclosure, a ration between the actual light-emitting area S11 after the first light-emitting element 201 is blocked by the first light-blocking structure 301 and the actual light-emitting area S21 after the second light-emitting element 202 is blocked by the second blocking structure 302 may be configured to be as close as possible to the ratio between the area S1 of the first light-emitting element 201 and the area S2 of the second light-emitting element 202, that is, S11/S21=S1/S2, such that the light-emitting brightness of the first light-emitting element 201 and the second light-emitting element 20 may be as same as possible when the first light-emitting element 201 and the second light-emitting element 202 are viewed from the same large viewing angle. Therefore, the viewing angle difference of the white light of the display panel 000 and the uniformity of the white light characteristics of the display panel 000 under different viewing angles may be improved.

Since the opening area S11 formed by the first light-blocking structure 301 is larger than the opening area S21 formed by the second light-blocking structure 302 and it is expected that the ratio between the actual light-emitting area S11 of the first light-emitting element 201 after being shielded by the first light-blocking structure 301 and the actual light-emitting area S21 of the second light-emitting element 202 blocked by the second light-blocking structure 302 is equal to the ratio of the area S1 of the first light-emitting element 201 to the area S2 of the second light-emitting element 202 as much as possible, based on that that the opening area S11 formed by the first light-blocking structure 301 is larger than the opening area S21 formed by the second light-blocking structure 302, the distance d1 between the first light-emitting element 201 and its corresponding first light-blocking structure 301 may need to be relatively small, and the distance d2 between the second light-emitting element 202 and the corresponding second light-blocking structure 302 may need to be relatively larger. That is, along the first direction X, the distances between different light-emitting elements 20 and their corresponding light-blocking structures 30 may be different, to balance the difference of the white light characteristics of the light-emitting elements 20 with different areas at large viewing angles in the display panel 000.

In some embodiments shown in FIG. 1, FIG. 19, and FIG. 20, along the first direction X, the width of the first light-blocking structure 301 may be W1 and the width of the second light-blocking structure 302 may be W2 where W1>W2.

In the display panel 000, the width of the light-blocking structures 30 corresponding to different light-emitting elements 20 may be configured differently. For example, the width W1 of the first light-blocking structure 301 corresponding to the first light-emitting element 201 may larger than the width W2 of the second light-blocking structure 302 corresponding to the second light-emitting element 202. Since the area S1 of the orthographic projection of the first light-emitting element 201 on the substrate 10 may be larger than the area S2 of the orthographic projection of the second light-emitting element 202 on the substrate 10 and the distance d1 from the first light-blocking structure 301 to the corresponding light-emitting element 201 may be larger than the distance d2 from the second light-blocking structure 302 to the corresponding second light-emitting element 202 along the first direction X, the actual light-emitting viewing angle α2 of the second light-emitting element 202 may be larger than the actual light-emitting viewing angle α1 of the first light-emitting element 201 and the width W2 of the second light-blocking structure 302 corresponding to the second light-emitting element 202 may be reduced. That is, the width W1 of the first light-blocking structure 301 corresponding to the first light-emitting element 201 may larger than the width W2 of the second light-blocking structure 302 corresponding to the second light-emitting element 202, along the first direction X. While satisfying the blocking of the light-emitting elements 20 by the corresponding light-blocking structures 30, the area ratio of the light-blocking structures 30 in the display panel 000 may be reduced as much as possible, such that the transmittance of the corresponding area may be improved when the camera under panel technology is applied in the display panel to ensure the photosensitive effect of the camera under the panel.

In some embodiments, the display panel 000 may further include the third light-emitting elements 203 and the area of the third light-emitting elements 203 may be S3. The light-blocking structures 30 may further include the third light-blocking structures 303. The orthographic projection of one third light-blocking structure 303 on the substrate 10 may surround one corresponding third light-emitting element 203. Along the first direction X, a distance from one third light-blocking structure 303 to the corresponding third light-emitting element 203 may be d3. When S1>S2>S3 and d1<d2<d3, the actual light-emitting viewing angle of the third light-emitting element 203 may be the largest, and the actual light-emitting viewing angle α1 of the first light-emitting element 201 may be the smallest. Therefore, along the first direction X, the width of the third light-blocking structure 303 corresponding to the third light-emitting element 203 may be set to be the smallest and smaller than the width W2 of the second light-blocking structure 302 corresponding to the second light-emitting element 202. While satisfying the blocking of the light-emitting elements 20 by the corresponding light-blocking structures 30, the area ratio of the light-blocking structures 30 in the display panel 000 may be reduced as much as possible, such that the transmittance of the corresponding area may be improved when the camera under panel technology is applied in the display panel to ensure the photosensitive effect of the camera under the panel.

Figure 21:
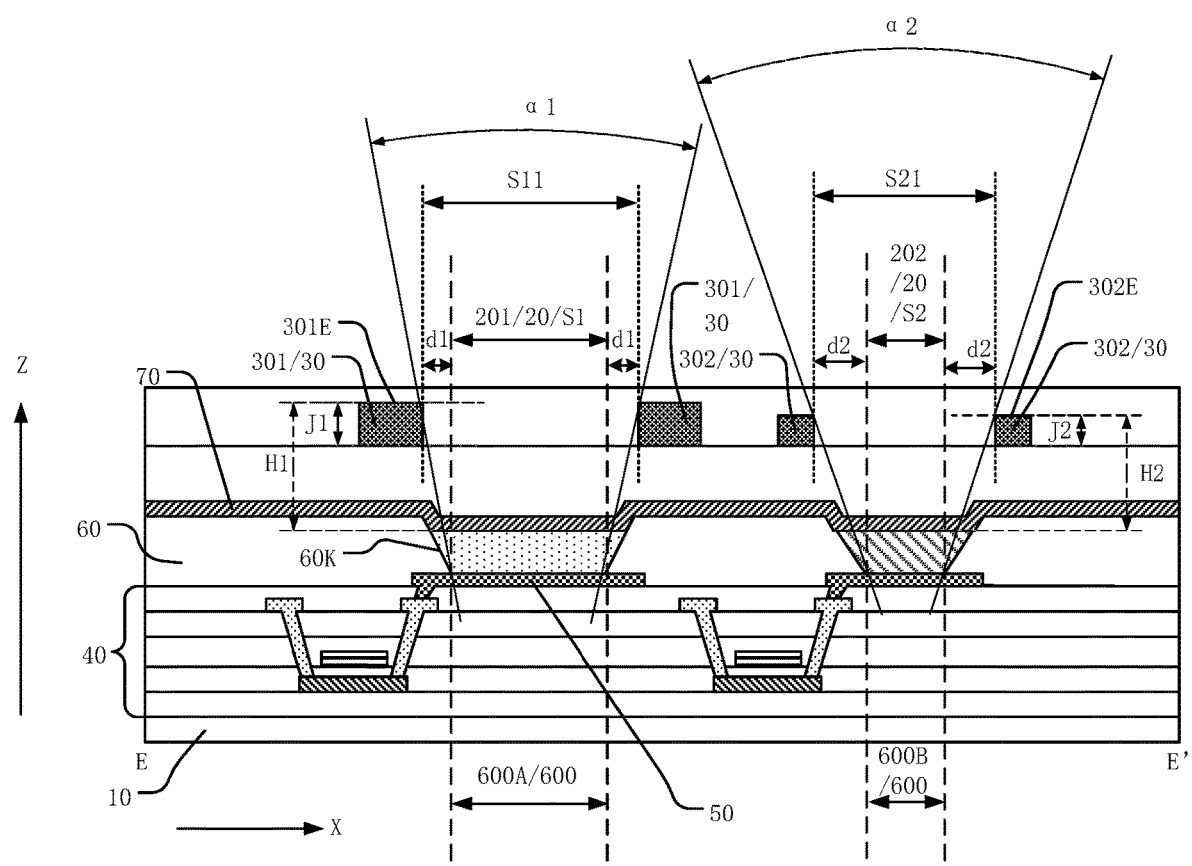
FIG. 21 illustrates another cross-sectional view of the display panel in FIG. 19 along an E-E' direction, consistent with various disclosed embodiments in the present disclosure.

In some embodiments shown in FIG. 1, FIG. 19 which is another enlarged view of the M1 region in FIG. 1, and FIG. 21 which is a cross-sectional view along the E-E' direction in FIG. 19, along a direction Z perpendicular to the plane where the substrate 10 is located, a distance between a side surface 301E of the first light-blocking structure 301 away from the corresponding first light-emitting element 201 and the corresponding first light-emitting element 201 may be H1, and a distance between a side surface 302E of the second light-blocking structure 302 away from the corresponding second light-emitting element 202 and the corresponding second light-emitting element 202 may be H2, where |H1−H2|>0.

As shown in FIG. 21, along the direction Z perpendicular to the plane where the substrate 10 is located, the distance H1 between the side surface 301E of the first light-blocking structure 301 away from the corresponding first light-emitting element 201 and the corresponding first light-emitting element 201 may be understood as a distance between the side surface 301E of the first light-blocking structure 301 away from the corresponding first light-emitting element 201 and a side surface of the light-emitting material layer of the corresponding first light-emitting element 201, and the distance H2 between the side surface 302E of the second light-blocking structure 302 away from the corresponding second light-emitting element 202 and the corresponding second light-emitting element 202 may be understood as a distance between the side surface 302E of the second light-blocking structure 302 away from the corresponding second light-emitting element 202 and a side surface of the light-emitting material layer of the corresponding second light-emitting element 202.

The actual light-emitting viewing angles of different light-emitting elements 20 may also be affected by the height of corresponding light-blocking structures 30. The height of one light-blocking structure 30 may be understood as a distance between a side surface of the light-blocking structure 30 away from one corresponding light-emitting element 20 and the corresponding light-emitting element 20 along the direction Z perpendicular to the plane where the substrate 10 is located. As shown in FIG. 21, in the present disclosure, the distance H1 between the side surface 301E of the first light-blocking structure 301 away from the corresponding first light-emitting element 201 and the corresponding first light-emitting element 201 may be configured to be larger than the distance H2 between the side surface 302E of the second light-blocking structure 302 away from the corresponding second light-emitting element 202 and the corresponding second light-emitting element 202, that is |H1−H2|>0. Therefore, the actual light-emitting viewing angles of the first light-emitting element 201 and the second light-emitting element 202 may be different after being blocked by the corresponding light-blocking structures. In one embodiment, the area S1 of the orthographic projection of the first light-emitting element 201 on the substrate 10 may be larger than the area S2 of the orthographic projection of the second light-emitting element 202 on the substrate 10. Correspondingly, along the direction Z perpendicular to the plane where the substrate 10 is located, the distance H1 between the side surface 301E of the first light-blocking structure 301 away from the corresponding first light-emitting element 201 and the corresponding first light-emitting element 201 may be configured to be larger than the distance H2 between the side surface 302E of the second light-blocking structure 302 away from the corresponding second light-emitting element 202 and the corresponding second light-emitting element 202, that is, S1>S2 and H1>H2. Therefore, when the area of one opening area 600 of the pixel definition layer 60 corresponding to one light-emitting element 20 is larger, the distance between the side surface of the corresponding light-blocking structure 30 away from the substrate 10 and the light-emitting element 20 may be larger. Correspondingly, the first light-blocking structure 301 may block more of the light-emitting viewing angle of the first light-emitting element 201, thereby reducing the actual light-emitting viewing angle of the first light-emitting element 201 and ensuring the actual light-emitting viewing angle of the second light-emitting element 202 with a small area as wide as possible. The difference of the white light characteristics of the light-emitting elements 20 with different areas at large viewing angles in the display panel 000 may be balanced, to improve the uniformity of the white light characteristics at different view angles and the display quality of the display panel 000.

For description purposes only, the above embodiments where the area S1 of the orthographic projection of the first light-emitting element 201 on the substrate 10 is larger than the area S2 of the orthographic projection of the second light-emitting element 202 on the substrate 10 and the distance H1 from the side surface 301E of the first light-blocking structure 301 away from the corresponding first light-emitting element 201 to the corresponding first light-emitting element 201 is larger than the distance H2 from the side surface 302E of the second light-blocking structure 302 away from the corresponding second light-emitting element 202 to the corresponding second light-emitting element 202 (that is, S1>S2 and H1>H2), are used as examples to illustrate the present disclosure, and do not limit the scope of the present disclosure. In some other embodiment, the area S1 of the orthographic projection of the first light-emitting element 201 on the substrate 10 may be larger than the area S2 of the orthographic projection of the second light-emitting element 202 on the substrate 10. Correspondingly, along the direction Z perpendicular to the plane where the substrate 10 is located, the distance H1 between the side surface 301E of the first light-blocking structure 301 away from the corresponding first light-emitting element 201 and the corresponding first light-emitting element 201 may be configured to be smaller than the distance H2 between the side surface 302E of the second light-blocking structure 302 away from the corresponding second light-emitting element 202 and the corresponding second light-emitting element 202, that is, S1>S2 and H1>H2. The present disclosure has no limit on this as long as the height of the light-blocking structures 30 corresponding to different light-emitting elements 20 are different.

In some embodiments, the first light-blocking structure 301 and the second light-blocking structure 302 may be formed in a same layer with a same material. Along the direction Z perpendicular to the plane where the substrate 10 is located, the distance H1 between the side surface 301E of the first light-blocking structure 301 away from the corresponding first light-emitting element 201 and the corresponding first light-emitting element 201 may be configured to be larger than the distance H2 between the side surface 302E of the second light-blocking structure 302 away from the corresponding second light-emitting element 202 and the corresponding second light-emitting element 202. That may be understood as that a thickness J1 of the first light-blocking structure 301 may be larger than a thickness J2 of the second light-blocking structure 302 along the direction Z perpendicular to the plane where the substrate 10 is located. Correspondingly, the first light-blocking structure 301 may block more of the light-emitting viewing angle of the first light-emitting element 201, thereby reducing the actual light-emitting viewing angle of the first light-emitting element 201 and ensuring the actual light-emitting viewing angle of the second light-emitting element 202 with a small area as wide as possible.

Figure 22:
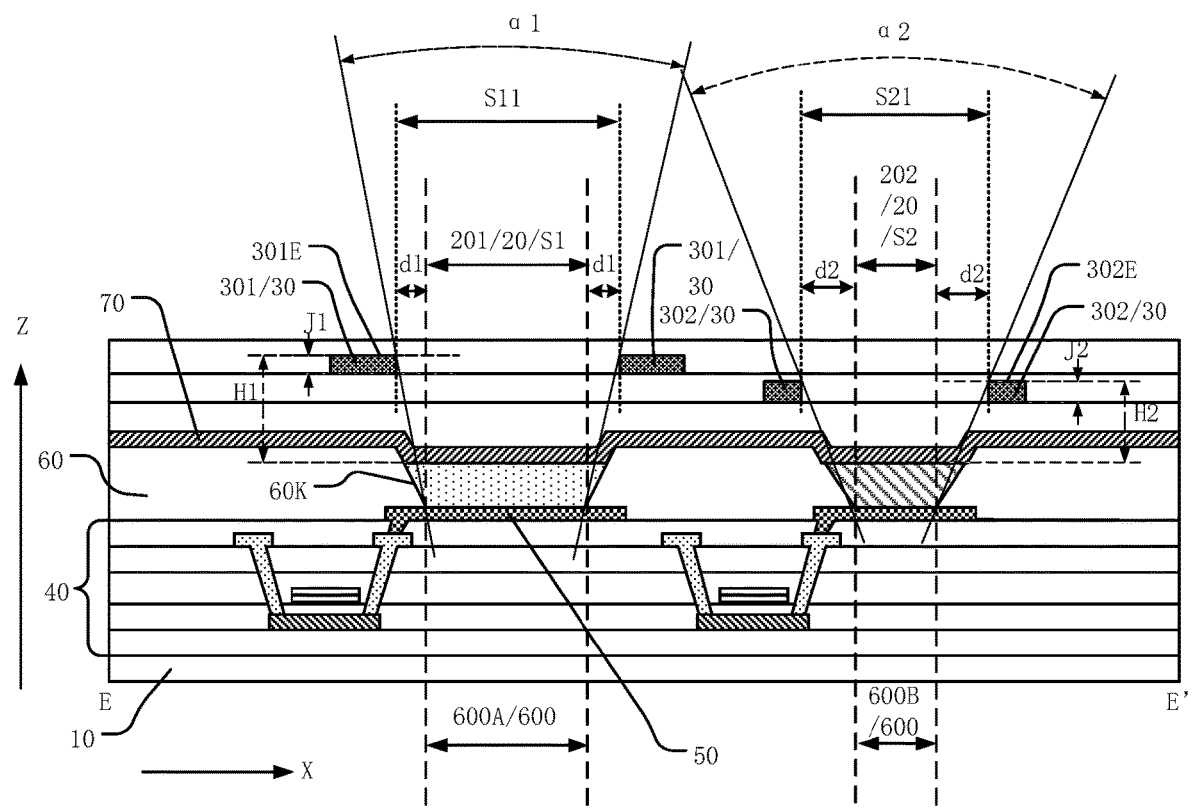
FIG. 22 illustrates another cross-sectional view of the display panel in FIG. 19 along an E-E' direction, consistent with various disclosed embodiments in the present disclosure.

In some other embodiments shown in FIG. 1, FIG. 19 which is another enlarged view of the M1 region in FIG. 1, and FIG. 22 which is a cross-sectional view along the E-E' direction in FIG. 19, the first light-blocking structure 301 and the second light-blocking structure 302 may be formed in different layers with a same material. Along the direction Z perpendicular to the plane where the substrate 10 is located, the distance H1 between the side surface 301E of the first light-blocking structure 301 away from the corresponding first light-emitting element 201 and the corresponding first light-emitting element 201 may be configured to be larger than the distance H2 between the side surface 302E of the second light-blocking structure 302 away from the corresponding second light-emitting element 202 and the corresponding second light-emitting element 202. That may be understood as that a film layer where the first light-blocking structure 301 is located may be disposed at a side of a film layer where the second light-blocking structure 302 is located away from the substrate 10 and a thickness J1 of the first light-blocking structure 301 may be equal to a thickness J2 of the second light-blocking structure 302. Correspondingly, the first light-blocking structure 301 may block more of the light-emitting viewing angle of the first light-emitting element 201, thereby reducing the actual light-emitting viewing angle of the first light-emitting element 201 and ensuring the actual light-emitting viewing angle of the second light-emitting element 202 with a small area as wide as possible.

Figure 23:
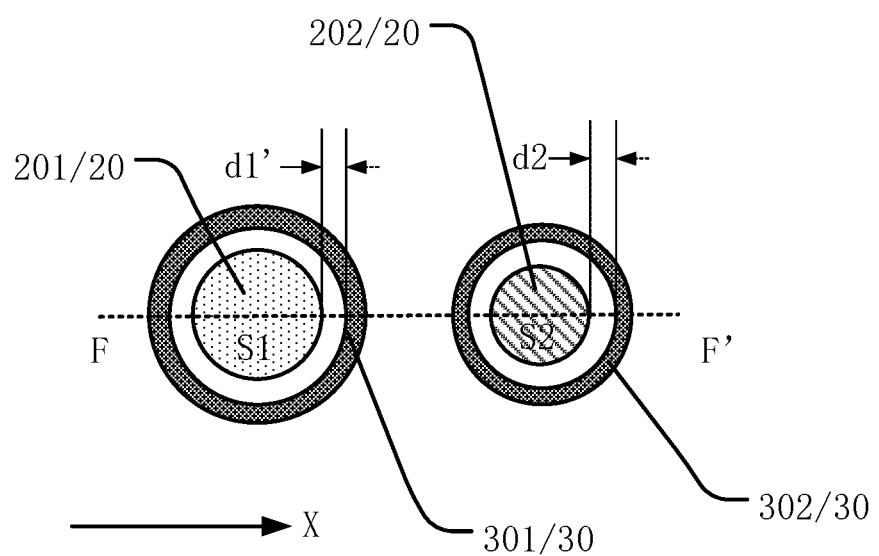
FIG. 23 illustrates another locally enlarged view of the M1 region in the display panel in FIG. 1 consistent with various disclosed embodiments in the present disclosure.
Figure 24:
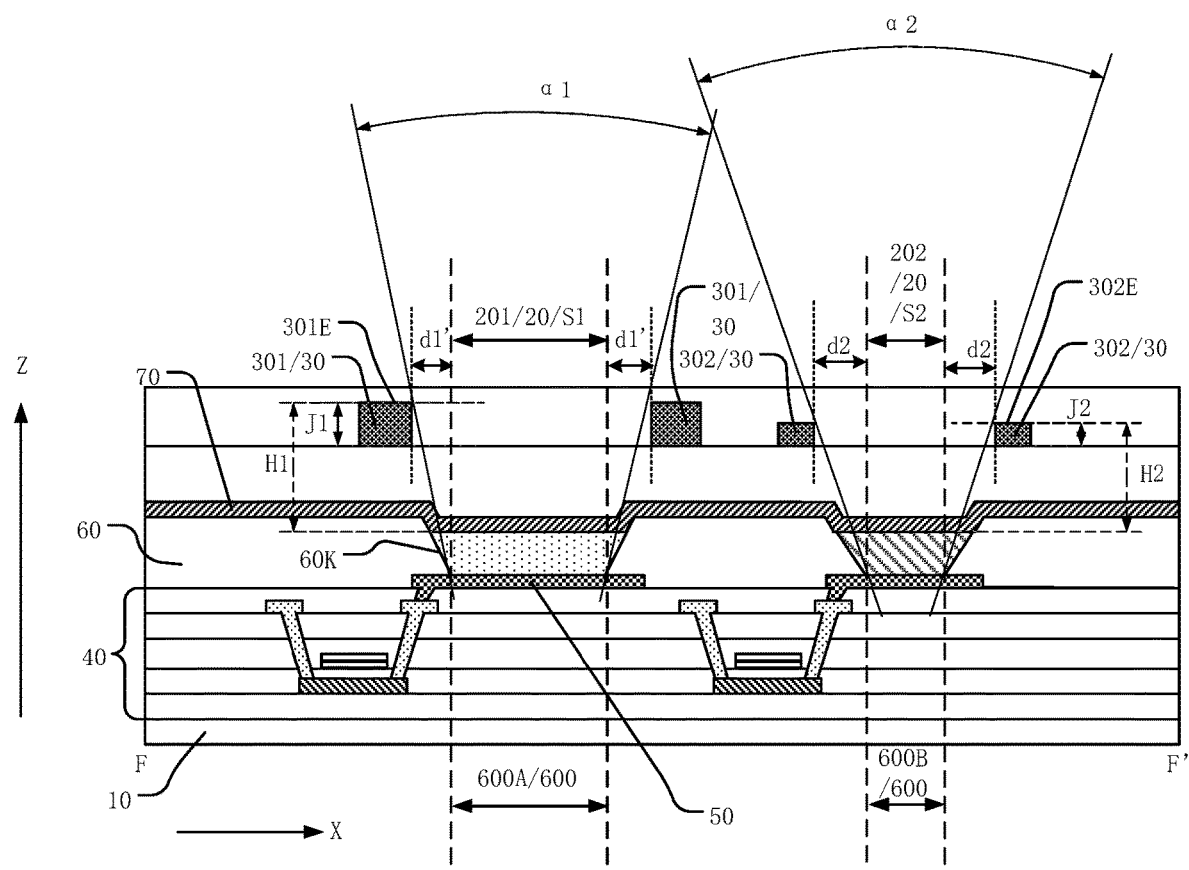
FIG. 24 illustrates a cross-sectional view of the display panel in FIG. 19 along an F-F' direction, consistent with various disclosed embodiments in the present disclosure.

In some other embodiments shown in FIG. 1, FIG. 19, FIG. 21, FIG. 23 which is another enlarged view of the M1 region in FIG. 1, and FIG. 24 which is a cross-sectional view along the F-F' direction in FIG. 23, the height of the light-blocking structures 30 that is, the distances between the side surfaces of the light-blocking structures 30 away from the corresponding light-emitting elements 20 and the corresponding light-emitting element 20 along the direction Z perpendicular to the plane where the substrate 10 is located, may be configured differently. Therefore, for the first light-emitting element 21 with a larger area, it may be equal to increase the distance H1 between the side surface 301E of the first light-blocking structure 301 away from the corresponding first light-emitting element 201 and the corresponding first light-emitting element 201 along the direction Z perpendicular to the plane where the substrate 10 is located. The light-emitting viewing angle of the first light-emitting element 201 after being blocked by the first light-blocking structure 301 may be reduced further. In one embodiment shown in FIG. 19 and FIG. 21, the area of the first light-emitting element 201 may be S1 and the area of the second light-emitting element 202 may be S2, where S1>S2. The distance between the first light-emitting element 201 and the corresponding first light-blocking structure 301 in the first direction X may be d1, and the distance between the second light-emitting element 202 and the corresponding second light-blocking structure 302 may be d2, where d1<d2. Therefore, after in the direction Z perpendicular to the plane where the substrate 10 is located, after the distance H1 between the side surface 301E of the first light-blocking structure 301 away from the corresponding first light-emitting element 201 and the corresponding first light-emitting element 201 is configured to be larger than the distance H2 between the side surface 302E of the second light-blocking structure 302 away from the corresponding second light-emitting element 202 and the corresponding second light-emitting element 202, the distance between the first light-emitting element 201 and the corresponding first light-blocking structure 301 in the first direction X may be appropriately increased, as shown in FIG. 23 and FIG. 24. That is, the distance d1' between the first light-emitting element 201 and the corresponding first light-blocking structure 301 in the first direction X in FIG. 24 may be larger than the distance d1 between the first light-emitting element 201 and the corresponding first light-blocking structure 301 in the first direction X in FIG. 21. Based on that the distance d2 between the second light-emitting element 202 and the corresponding second light-blocking structure 302 in the first direction X in FIG. 21 is same as the distance d2 between the second light-emitting element 202 and the corresponding second light-blocking structure 302 in the first direction X in FIG. 23, the difference between the distance d1' between the first light-emitting element 201 and the corresponding first light-blocking structure 301 in the first direction X in FIG. 24 and the distance d2 between the second light-emitting element 202 and the corresponding second light-blocking structure 302 in the first direction X may still exist, but may be reduced. It may also be understood that |d1−d2| in FIG. 21 is larger than |d1'−d2| in FIG. 24, to avoid the differential design of the distances between the light-blocking structures 30 corresponding different light-emitting elements 20 as much as possible. The process difficulty may be reduced and the process efficiency may be improved. Further, the distance d1' between the first light-emitting element 201 and the corresponding first light-blocking structure 301 in the first direction X in FIG. 24 may be larger than that the distance d1 between the first light-emitting element 201 and the corresponding first light-blocking structure 301 in the first direction X in FIG. 21. That may be equivalent to reducing the width of the first light-emitting element 201 to the corresponding first light-blocking structure 301 in the first direction X in FIG. 24, and the width of the first light-blocking structure 301 in the first direction X may be smaller than the width of the first light-blocking structure 301 in the first direction X in FIG. 21, which may further improve the transmittance of the display panel.

In some embodiments shown in FIG. 1 to FIG. 3, a distance between the first light-blocking structure 301 and the corresponding first light-emitting element 201 in the first direction X may be d01, and a distance between the first light-blocking structure 301 and the corresponding first light-emitting element 201 in a second direction Y may be d02, where d01=d02 and the second direction Y interests the first direction X in the direction parallel to the plane where the display panel 000 is located.

For one light-emitting element 20, for example, for one first light-emitting element 201, the distance d01 between the first light-emitting element 201 and the corresponding first light-blocking structure 301 in the first direction X may be equal to the distance d02 between the first light-emitting element 201 and the corresponding first light-blocking structure 301 in the second direction Y. Optionally, the orthographic projection of the first light-emitting element 201 on the substrate 10 may be a circle, and the orthographic projection of the first light-blocking structure 301 on the substrate 10 may be an annulus. The circle and the annulus may be concentric structures such that the distance d01 between the first light-emitting element 201 and the corresponding first light-blocking structure 301 in the first direction X may be equal to the distance d02 between the first light-emitting element 201 and the corresponding first light-blocking structure 301 in the second direction Y. A distance between the second light-blocking structure 302 and the corresponding second light-emitting element 202 in the first direction X may be d03, and a distance between the second light-blocking structure 302 and the corresponding second light-emitting element 202 in the second direction Y may be d04, where d03=d04. The second direction Y may be any direction different from the first direction parallel to the plane where the display panel 000 is located. Correspondingly, when the first light-emitting element 201 is observed from different viewing angles, the brightness difference of the different viewing angles may be reduced, to improve the uniformity of the brightness distribution under different viewing angles and the display uniformity of the light-emitting elements 20.

In some embodiments shown in FIG. 1, FIG. 2, FIG. 5, and FIG. 25 which is another enlarged view of the M1 region in FIG. 1, the orthographic projection of one light-emitting element 20 on the substrate 10 may be anyone of a circle, an oval, or a chamfered rectangle.

In the display panel 000, the orthographic projection of one light-emitting element 20 on the substrate 10 may be anyone of a circle, an oval, or a chamfered rectangle, to prevent the shape of the orthographic projection of the light-emitting element 20 on the substrate 10 from having right-angled edges and make the orthographic projection of the light-emitting element 20 on the substrate 10 to be close to a circle as much as possible. Therefore, diffraction energy may be distributed evenly in different directions, and the diffraction energy in a single direction may be reduced. Especially when the display panel 000 includes the first display region AA1 and the second display region AA2 shown in FIG. 5, the transmittance of the first display region AA1 may be smaller than the transmittance of the second display region AA2. The second display region AA2 may also be used as the setting area corresponding to the photosensitive element when being used as the display region. When the second display region AA2 is used as the setting area corresponding to the photosensitive element, at least the shape of the orthographic projection of the light-emitting element 20 in the second display region on the substrate 10 may be configured to be any one of a circle, an ellipse, or a chamfered rectangle. Therefore, the diffraction problem in the photosensitive element setting area may be effectively alleviated, to further improve optical effect of the camera under the panel in the second display region AA2.

The embodiment in FIG. 2 where the orthographic projection of one light-emitting element 20 on the substrate 10 is a circle is used as an example to illustrate the present disclosure. For the same light-emitting element 20, along the direction parallel to the plane of the display panel 000, the distance from the corresponding light-blocking structure 30 to the light-emitting element 20 may need to be equal in all directions, to reduce the brightness difference under different viewing angles when the light-emitting element 20 is observed under different viewing angles and improve the uniformity of the brightness distribution under different viewing angles. To achieve this, the light-blocking structure 30 corresponding to the circular light-emitting element 20 may be an annular structure, and the orthographic projection of the light-blocking structure 30 of the annular structure on the substrate 10 may surround the circular light-emitting element 20.

Figure 25:
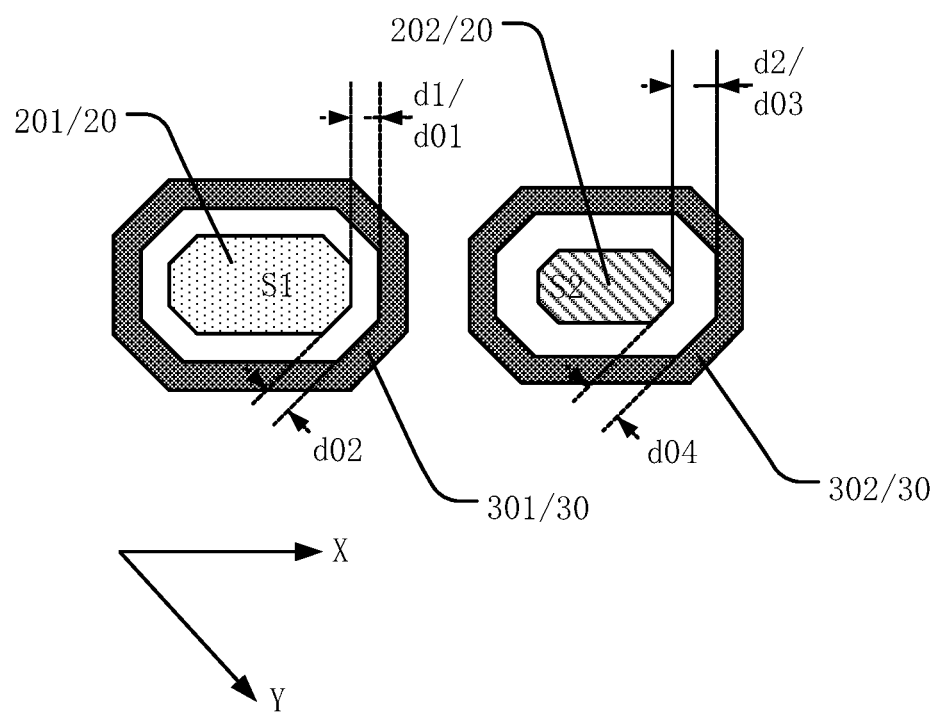
FIG. 25 illustrates another locally enlarged view of the M1 region in the display panel in FIG. 1 consistent with various disclosed embodiments in the present disclosure.

In another embodiment shown in FIG. 25, the orthographic projection of one light-emitting element 20 on the substrate 10 may be a chamfered rectangle. The light-blocking structure 30 corresponding to the light-emitting element 20 of a chamfered rectangle may also be an annular structure. The annular light-blocking structure 30 may include an inner edge close to the light-emitting element 20 and an outer edge away from the light-emitting element 20. At least the inner edge may be a chamfered rectangular structure matching the shape of the light-emitting element 20. The orthographic projection of the light-blocking structure 30 of the annular structure on the substrate 10 may surround the circular light-emitting element 20. Therefore, for one same light-emitting element 20, along the direction parallel to the plane of the display panel 000, the distance from the corresponding light-blocking structure 30 to the light-emitting element 20 may need to be equal in all directions, to reduce the brightness difference under different viewing angles when the light-emitting element 20 is observed under different viewing angles and improve the uniformity of the brightness distribution under different viewing angles.

The above embodiments where the orthographic projection of one light-emitting element 20 on the substrate 10 is one of the above structures are used as examples to illustrate the present disclosure, and do not limit the scopes of the present disclosure. In various other embodiments, the orthographic projection of one light-emitting element 20 on the substrate 10 is not limited to above structures, and may be configured to be other shapes that could reduce the diffraction effect.

Figure 26:
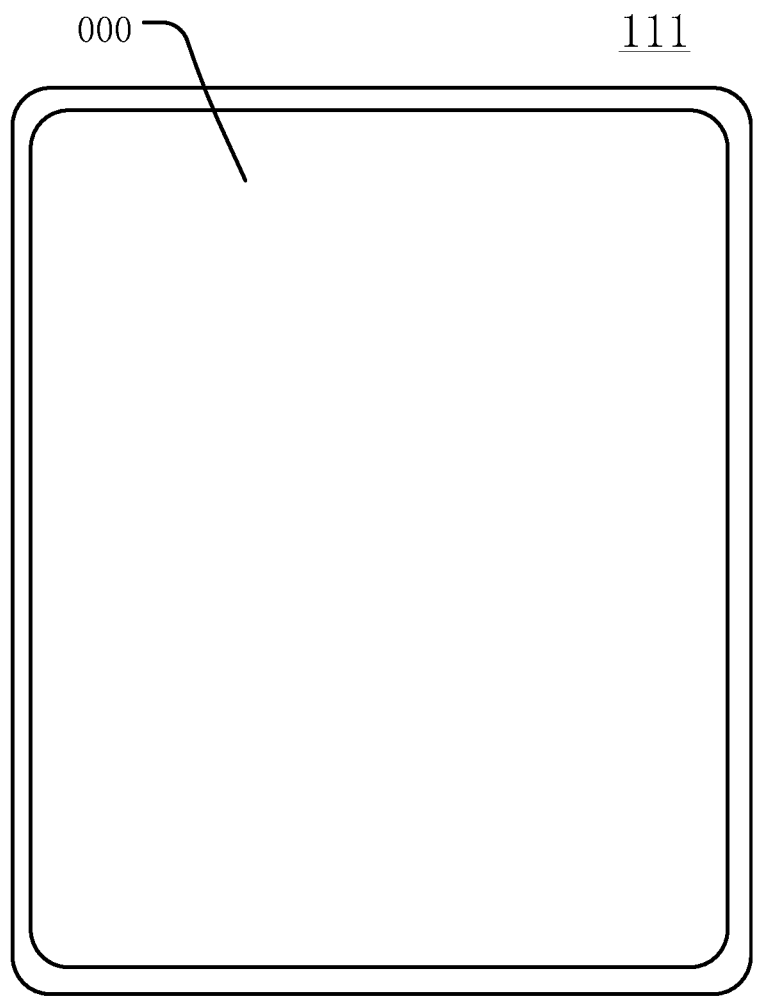
FIG. 26 illustrates an exemplary display device consistent with various disclosed embodiments in the present disclosure.

The present disclosure also provides a display device. As shown in FIG. 26, in one embodiment, the display device 111 may include any display panel 000 provided by various embodiments of the present disclosure. The embodiment shown in FIG. 26 where the display device 111 is a cell phone is used as an example only to illustrate the present disclosure, and does not limit the scopes of the present disclosure. In some other embodiments, the display device 111 may be any display device with display function, such as a computer, a television, a touch controller, or a vehicle display device.

In the present disclosure.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
   a substrate;
   light-emitting elements on a side of the substrate;
   light-blocking structures on a side of the light-emitting elements away from the substrate,
   wherein:
   the light-emitting elements include first light-emitting elements and second light-emitting elements;
   an area of an orthographic projection of a first light-emitting element on the substrate is S1, and an area of an orthographic projection of a second light-emitting element on the substrate is S2;
   a light-blocking structure includes a first light-blocking structure and a second light-blocking structure;
   an orthographic projection of the first light-blocking structure on the substrate at least partially surrounds a corresponding first light-emitting element and a distance from the first light-blocking structure to the corresponding first light-emitting element along a first direction is d1;
   an orthographic projection of the second light-blocking structure on the substrate at least partially surrounds a corresponding second light-emitting element and a distance from the second light-blocking structure to the corresponding second light-emitting element along the first direction is d2, wherein the first direction is parallel to a plane where the display panel is located; and $|S1-S2|>0$, and $|d1-d2|>0$.

2. The display panel according to claim 1, wherein S1>S2 and d1<d2.

3. The display panel according to claim 2, wherein: the display panel includes a first display area and a second display area, wherein the transmittance of the first display area is smaller than the transmittance of the second display area; the first light-emitting elements and the second light-emitting elements have different colors; and the first light-emitting elements and the second light-emitting elements are located in the first display area; or the first light-emitting elements and the second light-emitting elements are located in the second display area.

4. The display panel according to claim 2, wherein: the display panel includes a first display area and a second display area, wherein the transmittance of the first display area is smaller than the transmittance of the second display area; the first light-emitting elements and the second light-emitting elements have same colors; and the first light-emitting elements are located in the first display area and the second light-emitting elements are located in the second display area.

5. The display panel according to claim 1, wherein: the display panel includes a first display area and a second display area, wherein the transmittance of the first display area is smaller than the transmittance of the second display area; and the second display area includes at least a first region and a second region at least partially surrounding the first region, wherein the transmittance of the first region is larger than the transmittance of the second region.

6. The display panel according to claim 5, wherein:
   the first light-blocking structure is not provided between two adjacent light-emitting elements of a portion of the light-emitting elements in the first region.

7. The display panel according to claim 5, wherein:
   a width of the light-blocking structure in the first region along the first direction is W01, and a width of the light-blocking structure in the second region along the first direction is W02, wherein W01<W02.

8. The display panel according to claim 1, wherein:
   the display panel includes a first display area and a second display area, wherein the transmittance of the first display area is smaller than the transmittance of the second display area;
   the display panel further includes a light-blocking layer;
   in the first display area, the light-blocking layer includes first hollow regions, wherein an orthographic projection of one first hollow region overlaps one corresponding light-emitting element in the first display region; and
   the first light-emitting elements and the second light-emitting elements are located in the second display area, and the first light-blocking structures and the second light-blocking structures are independent from each other.

9. The display panel according to claim 1, wherein:

$|S1-S2|>|d1-d2|$.

10. The display panel according to claim 1, further including a third light-emitting element, wherein:

an area of an orthographic projection of the third light-emitting element on the substrate is S3;
the light-blocking structure further includes a third light-blocking structure;
an orthographic projection of the third light-blocking structure on the substrate at least partially surrounds the third light-emitting element; and
along the first direction, a distance from the third light-blocking structure to the third light-emitting element is d3, wherein, S1>S3, d1<d3, and/or, S2>S3, d2<d3.

11. The display panel according to claim 10, wherein:

$S1>S2>S3$, and $d1<d2<d3$.

12. The display panel according to claim 11, wherein: |(S1−S2)−(S2−S3)|>|(d1−d2)−(d2−d3)|.

13. The display panel according to claim 2, wherein:
the orthographic projection of one first light-blocking structure on the substrate surrounds one corresponding first light-emitting element;
an area of an opening area formed by the first light-blocking structure is S11;
the orthographic projection of one second light-blocking structure on the substrate surrounds one corresponding second light-emitting element;
an area of an opening area formed by the second light-blocking structure is S21; and
S11>S21, and S11/S21=S1/S2.

14. The display panel according to claim 2, wherein:
along the first direction, a width of one first light-blocking structure is W1 and a width of one second light-blocking structure is W2, wherein W1>W2.

15. The display panel according to claim 1, wherein:
along a direction perpendicular to the plane where the substrate is located, a distance from a side surface of one first light-blocking structure away from one corresponding first light-emitting element to the corresponding first light-emitting element is H1, and a distance from a side surface of one second light-blocking structure away from one corresponding second light-emitting element to the corresponding second light-emitting element is H2, wherein |H1−H2|>0.

16. The display panel according to claim 15, wherein:

$S1>S2$ and $H1>H2$.

17. The display panel according to claim 1, wherein:
along the first direction, a distance from one first light-blocking structure to one corresponding first light-emitting element is d01;
along a second direction, a distance from the first light-blocking structure to the corresponding first light-emitting element is d02; and
d01=d02, wherein the second direction and the first direction intersect in a direction parallel to the plane where the display panel is located.

18. The display panel according to claim 17, wherein:
a shape of the orthographic projection of one first light-emitting element on the substrate is a circle, and a shape of the orthographic projection of one corresponding first light-blocking structure on the substrate is a ring, wherein the circle and the ring are a concentric structure.

19. The display panel according to claim 1, wherein:
the first light-emitting element is a blue light-emitting element or a green light-emitting element, and the second light-emitting element is a red light-emitting element.

20. A display device, comprising a display panel, wherein the display panel includes:
a substrate;
light-emitting elements on a side of the substrate; and
a light-blocking structure on a side of one light-emitting element away from the substrate,
wherein:
one light-emitting element includes a first light-emitting element and a second light-emitting element;
an area of an orthographic projection of one first light-emitting element on the substrate is S1, and an area of an orthographic projection of one second light-emitting element on the substrate is S2;
one light-blocking structure includes a first light-blocking structure and a second light-blocking structure;
an orthographic projection of one first light-blocking structure on the substrate at least partially surrounds one corresponding first light-emitting element and a distance from the first light-blocking structure to the corresponding first light-emitting element along a first direction is d1;
an orthographic projection of one second light-blocking structure on the substrate at least partially surrounds one corresponding second light-emitting element and a distance from the second light-blocking structure to the corresponding second light-emitting element along the first direction is d2, wherein the first direction is parallel to a plane where the display panel is located; and $|S1−S2|>0$, and $|d1−d2|>0$.

* * * * *